US012725645B2

(12) United States Patent
Irizarry et al.

(10) Patent No.: US 12,725,645 B2
(45) Date of Patent: Sep. 1, 2026

(54) BIPOLAR DECODERS FOR NONVOLATILE MEMORY

(71) Applicant: Sandisk Technologies, Inc., Milpitas, CA (US)

(72) Inventors: Nicolas Irizarry, Folsom, CA (US); Jaydip Patel, Folsom, CA (US); Christopher J. Petti, Mountain View, CA (US); Vincent Shih, Cupertino, CA (US)

(73) Assignee: Sandisk Technologies, Inc., Milpitas, CA (US)

( * ) Notice: Subject to any disclaimer, the term of this patent is extended or adjusted under 35 U.S.C. 154(b) by 75 days.

(21) Appl. No.: 18/752,697

(22) Filed: Jun. 24, 2024

(65) Prior Publication Data

US 2025/0391454 A1 Dec. 25, 2025

(51) Int. Cl.
*G11C 11/16* (2006.01)

(52) U.S. Cl.
CPC ...... *G11C 11/1657* (2013.01); *G11C 11/1655* (2013.01); *G11C 11/1659* (2013.01)

(58) Field of Classification Search
CPC ............ G11C 11/1657; G11C 11/1655; G11C 11/1659
See application file for complete search history.

(56) References Cited

U.S. PATENT DOCUMENTS 5,831,454 A 11/1998 Keating
7,009,909 B2 3/2006 Rinerson et al.
7,701,747 B2 4/2010 Park et al.
8,755,213 B2 6/2014 DeBrosse et al.
8,934,280 B1 1/2015 Kuo et al.
9,123,410 B2 9/2015 Castro et al.
9,286,975 B2 3/2016 Chu et al.
9,406,363 B2 8/2016 Barkley et al.
(Continued)

FOREIGN PATENT DOCUMENTS

CN 112599167 A 4/2021
KR 20220107353 A 8/2022

OTHER PUBLICATIONS

U.S. Appl. No. 18/824,608, filed Sep. 4, 2024.
(Continued)

*Primary Examiner* — Khamdan N. Alrobaie
(74) *Attorney, Agent, or Firm* — Pearl Cohen LLP

(57) ABSTRACT

To program MRAM memory cells current must flow from the memory cell's corresponding bit line to its corresponding word line or from the word line to bit line. To accomplish this, the bit line and word line decoders must be capable of sourcing current (when driving a line positive) and sinking current (when pulling the line negative) to account the memory cell's bipolar nature. Consequently, the decoders must be bipolar. For the negative select switches NMOS devices are used and for the positive select switches PMOS switches are used. To reduce layout area and routing, the negative select switches and positive select switches are separately grouped, with a subset of the positive select switches located between subsets of the negative select switches and vice-versa. The connection for the decoder switches are routed to a central hook-up region for connection to the control lines of the cross-point array.

20 Claims, 32 Drawing Sheets

(56) References Cited

U.S. PATENT DOCUMENTS

| | | | | |
|---|---|---|---|---|
| 9,437,293 | B1 | 9/2016 | Kripanidhi et al. | |
| 11,133,044 | B2 | 9/2021 | Chiang et al. | |
| 11,817,150 | B2 | 11/2023 | Shao et al. | |
| 11,854,592 | B2 | 12/2023 | Parkinson et al. | |
| 11,887,661 | B2 | 1/2024 | Tortorelli et al. | |
| 11,900,998 | B2 | 2/2024 | Srinivasan et al. | |
| 2006/0221702 | A1* | 10/2006 | Scheuerlein | G11C 5/063 365/185.23 |
| 2009/0168481 | A1 | 7/2009 | Stipe | |
| 2011/0019495 | A1* | 1/2011 | Scheuerlein | G11C 8/14 365/189.11 |
| 2013/0223133 | A1 | 8/2013 | Azuma et al. | |
| 2015/0132917 | A1 | 5/2015 | Siau et al. | |
| 2019/0006358 | A1* | 1/2019 | Horng | H10D 84/038 |
| 2019/0347219 | A1 | 11/2019 | Ho | |
| 2020/0090744 | A1* | 3/2020 | Hara | G11C 11/1659 |
| 2021/0134363 | A1* | 5/2021 | Sirocka | G11C 13/0002 |
| 2021/0174869 | A1 | 6/2021 | Hirano | |
| 2022/0069207 | A1 | 3/2022 | McCrate | |
| 2023/0363181 | A1 | 11/2023 | Lai et al. | |
| 2024/0221823 | A1 | 7/2024 | Roy | |

OTHER PUBLICATIONS

U.S. Appl. No. 18/825,487, filed Sep. 5, 2024.
International Search Report & The Written Opinion of the International Searching Authority dated Apr. 23, 2025, International Application No. PCT/US2025/011301.
Ex Parte Quayle dated Feb. 19, 2026, U.S. Appl. No. 18/824,608, filed Sep. 4, 2024.

* cited by examiner

Host
120
Host Processor
122
Host Memory
124
128
PCIe Interface
126
130
PCIe
100
Controller
102
Memory Packages
104
BEP
112
FEP
110
DDR
DRAM/ ReRAM/ MRAM
106
Memory System 600
611
601
608
606
memory array
602
row
decoder
622
WL
drivers
624
row control circuitry 620
column control circuitry 610
column
decoder
612
BL
drivers
614
R/W
circuits
616
column address signals
row address
signals
control
signals
System Control Logic 660
host Fill 925
Liner 921
Bit Line 911
Conductive Spacer 909
MgO Cap 908
Free Layer 907
MgO Barrier 905
Reference Layer 903
Conductive Spacer 902
Liner 923
Fill 927
Word Line 901

Word Line 2
1120
Story 1 cell
Free Layer
1111
Tunnel Barrier
1113
Reference Layer
1115
Threshold Switching Selector
1119
MRAM
1112
Bit Line
1110
Story 0 cell
Free Layer
1101
Tunnel Barrier
1103
Reference Layer
1105
Threshold Switching Selector
1109
MRAM
1102
Word Line 1
1100

Story0
VPP
WL Driver
624
RWL
1450
Selector
MRAM
RBL
BL Driver
614
VNN
Iread
Story1
VPP
BL Driver
614
RBL
1452
Selector
MRAM
RWL
WL Driver
624
VNN
Iread Story0 read Story1 read Address 1782
Digital Media Control Circuit 1780
1786
Core (#N Bank)
1792
Bank (#n module)
Bank Control 1566
Module
Module Logic 1568
1556
1562
1564
1554
1558
1560

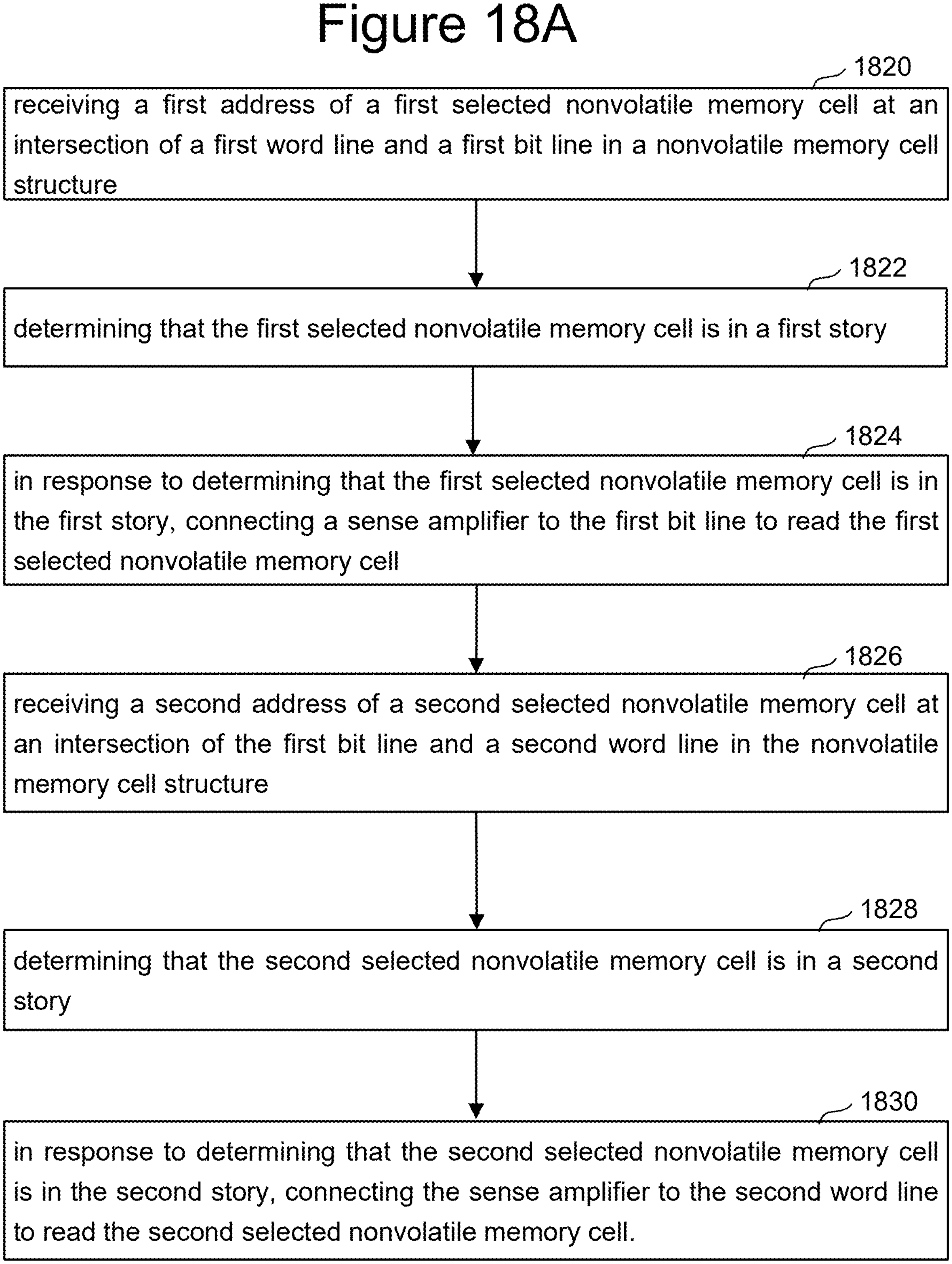

Figure 18A 1820
receiving a first address of a first selected nonvolatile memory cell at an intersection of a first word line and a first bit line in a nonvolatile memory cell structure 1822
determining that the first selected nonvolatile memory cell is in a first story 1824
in response to determining that the first selected nonvolatile memory cell is in the first story, connecting a sense amplifier to the first bit line to read the first selected nonvolatile memory cell 1826
receiving a second address of a second selected nonvolatile memory cell at an intersection of the first bit line and a second word line in the nonvolatile memory cell structure 1828
determining that the second selected nonvolatile memory cell is in a second story 1830
in response to determining that the second selected nonvolatile memory cell is in the second story, connecting the sense amplifier to the second word line to read the second selected nonvolatile memory cell.

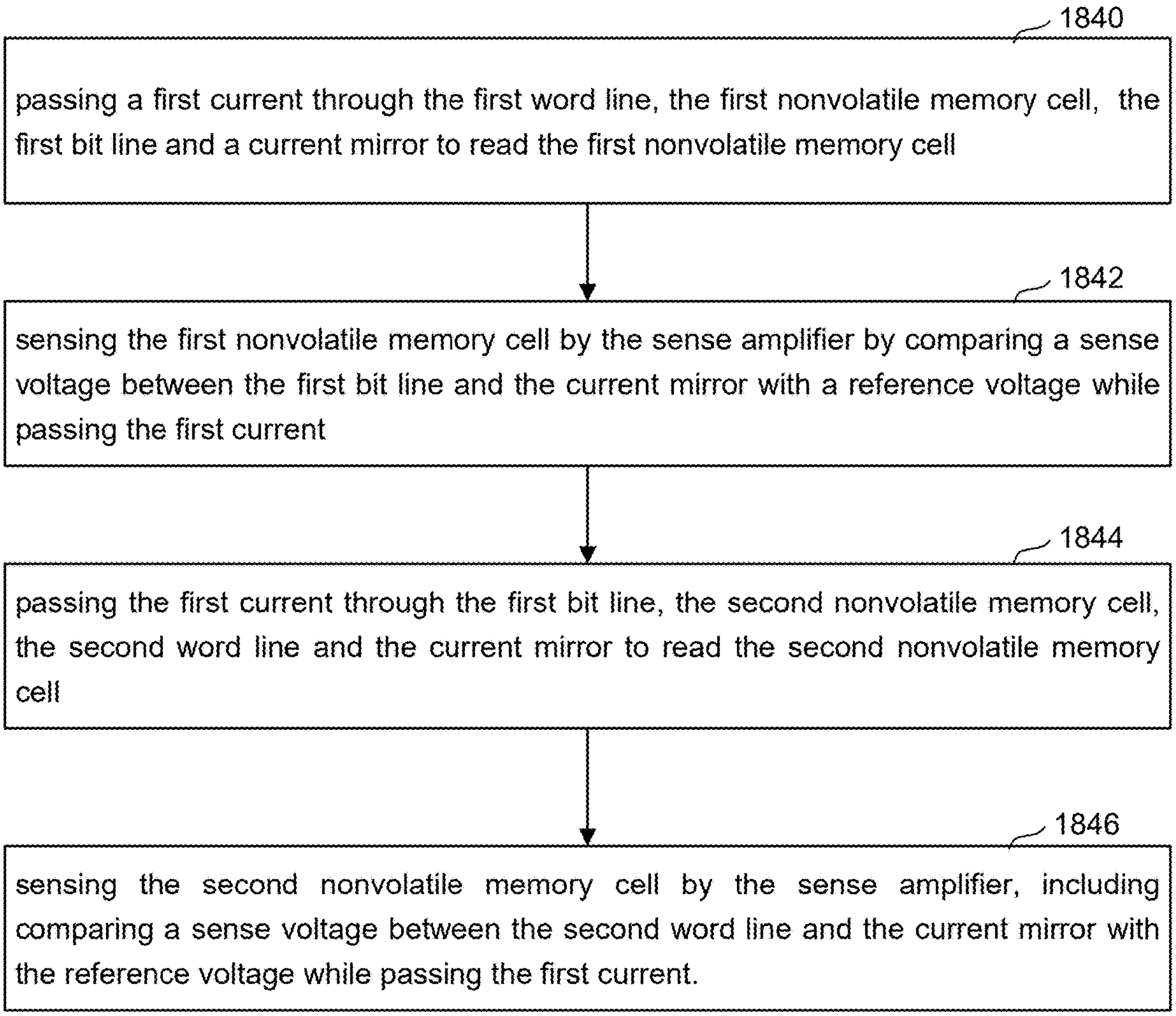

Figure 18B

1840 passing a first current through the first word line, the first nonvolatile memory cell, the first bit line and a current mirror to read the first nonvolatile memory cell

1842 sensing the first nonvolatile memory cell by the sense amplifier by comparing a sense voltage between the first bit line and the current mirror with a reference voltage while passing the first current

1844 passing the first current through the first bit line, the second nonvolatile memory cell, the second word line and the current mirror to read the second nonvolatile memory cell

1846 sensing the second nonvolatile memory cell by the sense amplifier, including comparing a sense voltage between the second word line and the current mirror with the reference voltage while passing the first current.

To Figure 19B pos_pane 1903-31

GPS<31> pos_global

GPD<31>

1905-31 0V 1925-31 1927-0 1927-31

LPS<31> LPS<0> LPS<31>

Positive decoding paths 1947-31 0V 1949-0 0V 0V

LBL<31> LBL<991> LBL<1023>

LPD<31> LPD<0> LPD<31>

1949-31

Ground decoding paths

Negative decoding paths

LNS<31> LNS<0> LNS<31>

1965-31 1967-0 1967-31

1983-31 0V

GND<31> neg_global

GNS<31>

1985-31 neg_pane

From Figure 19A

Form on a first die a bipolar decoder circuit for a first set of control lines of a cross-point memory array of nonvolatile memory cells each connected between one of the first set of control lines and one of a second set of control lines

2701

2703

Form positive voltage select switches, each configured to supply a positive voltage level to a corresponding one of the first set of control lines, including forming first and second subsets of the plurality of positive voltage select switches on the first die

2705

Form negative voltage select switches, each configured to supply a negative voltage level to a corresponding one of the first set of control lines, including forming a first subset of the plurality of negative voltage select switches on the first die between the first and second subsets of the plurality of positive voltage select switches

2707

Form metal lines running over the positive voltage select switches and the negative, each of the metal lines connecting a corresponding one of either the positive voltage select switches or the negative voltage switches to a connection for the corresponding one of the first set of control lines, the connections located over a central region of the die Connect cross-point array to decoder

2711

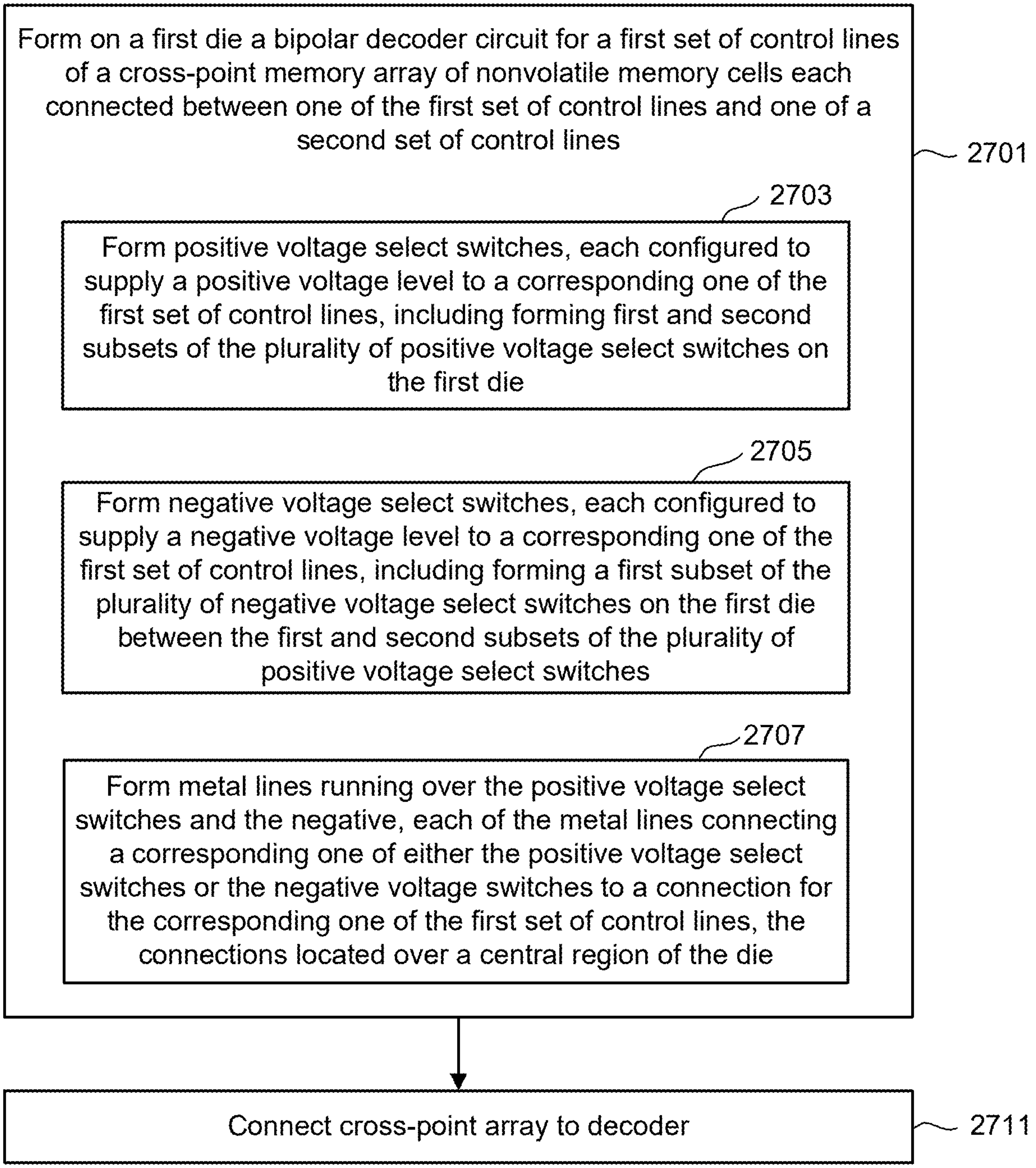

Figure 27

BIPOLAR DECODERS FOR NONVOLATILE MEMORY

BACKGROUND

Memory is widely used in various electronic devices such as cellular telephones, digital cameras, personal digital assistants, medical electronics, mobile computing devices, non-mobile computing devices, and data servers. Memory may comprise nonvolatile memory or volatile memory. A non-volatile memory allows information to be stored and retained even when the nonvolatile memory is not connected to a source of power (e.g., a battery).

One example of a nonvolatile memory is magnetoresistive random access memory (MRAM), which uses magnetization to represent stored data, in contrast to some other memory technologies that use electronic charges to store data. Generally, MRAM includes a large number of magnetic memory cells formed on a semiconductor substrate, where each memory cell represents (at least) one bit of data. A bit of data is written to a memory cell by changing the direction of magnetization of a magnetic element within the memory cell, and a bit is read by measuring the resistance of the memory cell (low resistance typically represents a "0" bit and high resistance typically represents a "1" bit). As used herein, direction of magnetization is the direction that the magnetic moment is oriented.

Some nonvolatile memory arrays are arranged in a cross-point arrangement with word lines extending perpendicularly to bit lines and with memory cells formed where they cross. Some cross-point memory arrays have two or more stories or levels of memory cells.

Read/write circuits may be used to read data from and write data to nonvolatile memory cells. Data may be read by sensing current or voltage at sense nodes while current flows through selected memory cells. Sense amplifiers may be provided to performing sensing. Sense amplifiers and/or other read/write circuits may occupy a significant area on a memory die. Efficient design may reduce the area occupied by sense amplifiers and/or other circuits.

BRIEF DESCRIPTION OF THE DRAWING

Like-numbered elements refer to common components in the different figures.

FIG. 18A illustrates an examples of a method that includes connecting a sense amplifier to a bit line and to a word line according to the story in which a nonvolatile memory cell is located.

FIG. 18B illustrates an example that includes sensing nonvolatile memory cells in different stories using the same sense amplifier.

FIG. 27 is a flowchart of an embodiment for forming a memory device including the decoder structure of FIGS. 19A-26.

DETAILED DESCRIPTION

In a memory array with a cross-point type architecture, a first set of conductive lines runs across the surface of a substrate (e.g., word lines or WLs) and a second set of conductive lines run over the substrate in a direction perpendicular to the first set of conductive lines (e.g., bit lines or BLs). The memory cells are located at the cross-point junctions of the two sets of conductive lines. Embodiments for the memory cells can include a programmable resistance element, such as an MRAM element, which may be connected in series with a selector switch (selector) in a cross-point memory structure.

In some memory structures, including cross-point MRAM memory structures, memory cells may be formed in two or more stories (e.g., a first story formed between a first word line layer and a bit line layer and a second story formed between the bit line layer and a second word line layer). Accessing memory cells in such structures may be challenging. For example, where current direction is the same in both layers (e.g., current flowing upwards through memory cells), current flows from word lines to bit lines in the first story and flows from bit lines to word lines in the second story. This may require dedicated circuits (e.g., sense amplifiers) for each story.

To program MRAM memory cells (i.e., change state from logical 1 to logical 0 or vice versa) current must flow from the memory cell's corresponding bit line to its corresponding word line or from the word line to bit line in the opposite case. To accomplish this, the bit line and word line decoders must be capable of sourcing current (when driving a line positive) and sinking current (when pulling the line negative) to account the memory cell's bipolar nature. Consequently, the decoders must be bipolar. For the negative select switches NMOS devices are used and for the positive select switches PMOS switches are used. To reduce layout area and routing, in embodiments for a bipolar decoder the negative select switches and positive select switches are separately grouped, with a subset of the positive select switches located between subsets of the negative select switches and vice-versa. The connection for the decoder switches are routed to a central hook-up region for connection to the control lines of the cross-point array.

Figure 1:
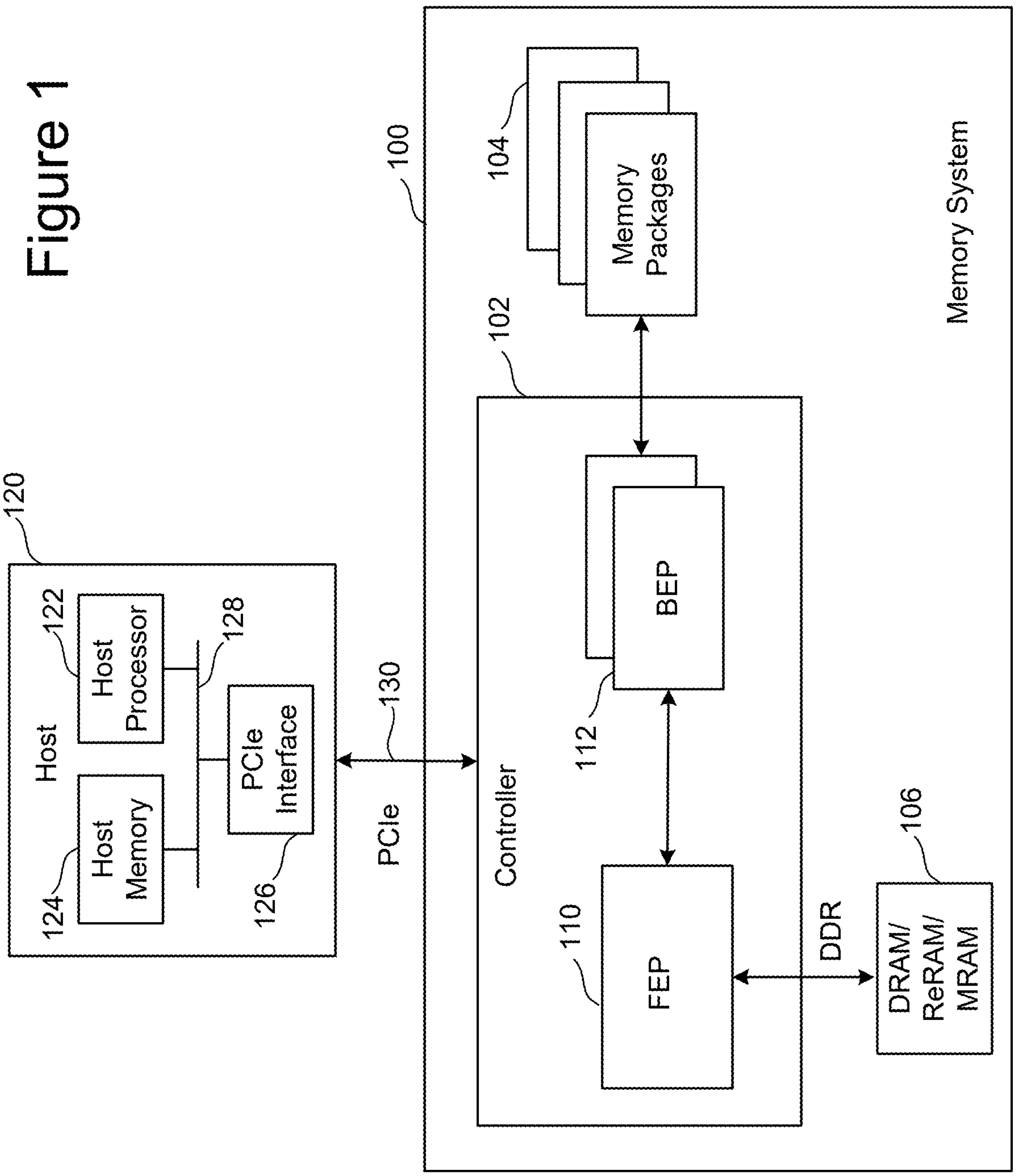
FIG. 1 is a block diagram of one embodiment of a memory system connected to a host.

FIG. 1 is a block diagram of one embodiment of a memory system 100 connected to a host 120. Memory system 100 can implement the technology presented herein for managing error rates. Many different types of memory systems can be used with the technology proposed herein. Example memory systems include solid state drives ("SSDs"), memory cards including dual in-line memory modules (DIMMs) for DRAM replacement, and embedded memory devices; however, other types of memory systems can also be used.

Memory system 100 of FIG. 1 comprises a controller 102, nonvolatile memory 104 for storing data, and local memory (e.g., DRAM/ReRAM/MRAM) 106. Controller 102 comprises a Front End Processor (FEP) circuit 110 and one or more Back End Processor (BEP) circuits 112. In one embodiment FEP circuit 110 is implemented on an Application Specific Integrated Circuit (ASIC). In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other nonvolatile storage system). The BEP circuit 112 manages memory operations in the memory packages/die at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, nonvolatile memory 104 comprises a plurality of memory packages. Each memory package includes one or more memory die. Therefore, controller 102 is connected to one or more nonvolatile memory die. In one embodiment, each memory die in the memory packages 104 utilize NAND flash memory (including two dimensional NAND flash memory and/or three dimensional NAND flash memory). In other embodiments, the memory package can include other types of memory, such as storage class memory (SCM) based on resistive random access memory (such as ReRAM, MRAM, FeRAM or RRAM) or a phase change memory (PCM). In other embodiments, the BEP or FEP can be included on the memory die.

Controller 102 communicates with host 120 via an interface 130 that implements a protocol such as, for example, NVM Express (NVMe) or Compute Express Link (CXL) over PCI Express (PCIe) or using JEDEC standard Double Data Rate or Low-Power Double Data Rate (DDR or LPDDR) interface such as DDR5 or LPDDR5. For working with memory system 100, host 120 includes a host processor 122, host memory 124, and a PCIe interface 126 connected along bus 128. Host memory 124 is the host's physical memory, and can be DRAM, SRAM, MRAM, nonvolatile memory, or another type of storage. Host 120 is external to and separate from memory system 100. In one embodiment, memory system 100 is embedded in host 120.

Figure 2:
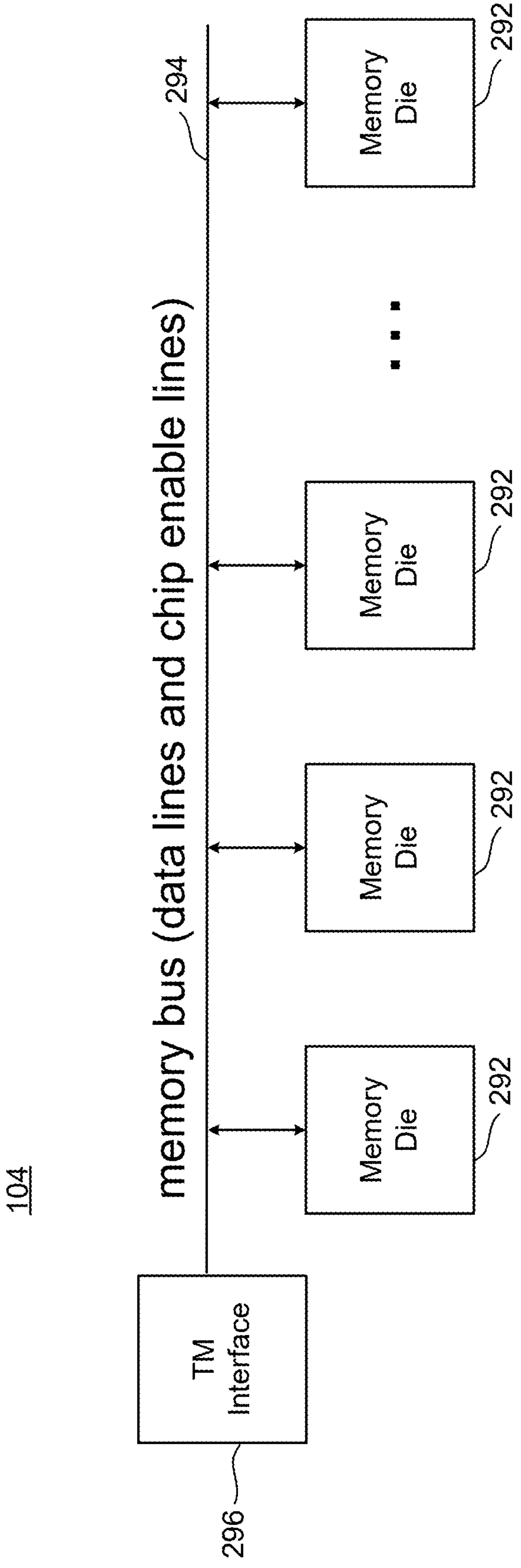
FIG. 2 is a block diagram of one embodiment of a memory package.

FIG. 2 is a block diagram of one embodiment of a memory package 104 that includes a plurality of memory die 292 connected to a memory bus 294 (data lines and chip enable lines). The memory bus 294 connects to a Toggle Mode Interface 296 for communicating with the TM Interface of a BEP circuit. In some embodiments, the memory package can include a small controller connected to the memory bus and the TM Interface. The memory package can have one or more memory die. In one embodiment, each memory package includes eight or 16 memory die; however, other numbers of memory die can also be implemented. In another embodiment, the Toggle Interface is instead JEDEC standard DDR or LPDDR with or without variations such as relaxed time-sets or smaller page size. The technology described herein is not limited to any particular number of memory die.

Figure 3:
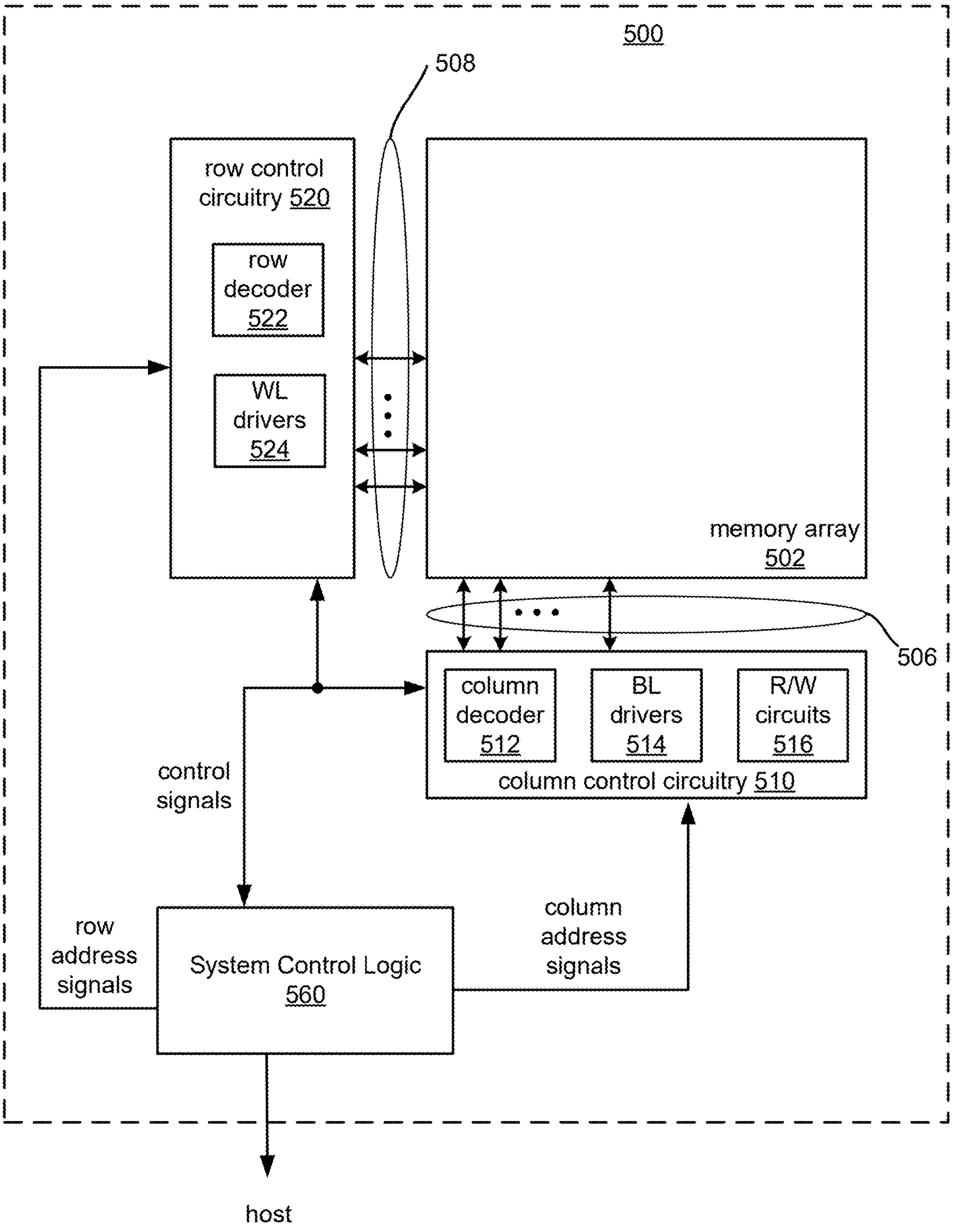
FIG. 3 is a block diagram of one embodiment of a memory die.

FIG. 3 is a block diagram that depicts one example of a memory system 500 that can implement the technology described herein. Memory system 500 includes a memory array 502 that can include any of memory cells described in the following. The array terminal lines of memory array 502 include the various layer(s) of word lines organized as rows, and the various layer(s) of bit lines organized as columns. However, other orientations can also be implemented. Memory system 500 includes row control circuitry 520, connected to respective word lines of the memory array 502 through lines 508. Row control circuitry 520 receives row address signals and one or more various control signals from system control logic 560, and typically may include such circuits as row decoders 522 and word line (WL)l drivers 524 for both reading and writing operations.

Memory system 500 also includes column control circuitry 510 whose input/outputs 506 are connected to respective bit lines of the memory array 502. Although only a single block is shown for memory array 502, a memory die can include multiple arrays or "tiles" that can be individually accessed. Column control circuitry 510 receives column address signals and one or more various control signals from System Control Logic 560, and typically may include such circuits as column decoders 512, bit line (BL) drivers 514, as well as read/write (R/W) circuits 516, which may include, for example, sense amplifiers for reading.

System control logic 560 receives data and commands from a host and provides output data and status to the host. In other embodiments, system control logic 560 receives data and commands from a separate controller circuit and provides output data to that controller circuit, with the controller circuit communicating with the host. In some embodiments, the system control logic 560 can include a state machine that provides die-level control of memory operations. In one embodiment, the state machine is programmable by software. In other embodiments, the state machine does not use software and is completely implemented in hardware (e.g., electrical circuits). In another embodiment, the state machine is replaced by a micro-controller, with the micro-controller either on or off the memory chip. The system control logic 560 can also include a power control module, which controls the power and voltages supplied to the rows and columns of the memory array 502 during memory operations and may include charge pumps and regulator circuit for creating regulating voltages. System control logic 560 may include one or more state machines, registers and other control logic for controlling the operation of memory system 500.

In some embodiments, all of the elements of memory system 500, including the system control logic 560, can be formed as part of a single die (e.g., a memory die 292 of FIG. 2). In other embodiments, some or all of the system control logic 560 can be formed on a different die.

For purposes of this document, the phrase "one or more control circuits" can include a controller, a state machine, a micro-controller and/or other control circuitry as represented by the system control logic 560 and/or other analogous circuits that are used to control nonvolatile memory.

In one embodiment, memory structure 502 comprises a three dimensional memory array of nonvolatile memory cells in which multiple memory levels are formed above a single substrate, such as a wafer. The memory structure may comprise any type of nonvolatile memory that are monolithically formed in one or more physical levels of memory cells having an active area disposed above a silicon (or other type of) substrate. In another embodiment, memory structure 502 comprises a two dimensional memory array of nonvolatile memory cells.

The exact type of memory array architecture or memory cell included in memory structure 502 is not limited to any particular example. Many different types of memory array architectures or memory technologies can be used to form memory structure 502. Examples of suitable technologies for memory cells of the memory structure 502 include NAND flash memories, ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 502 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data using magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a programming current pulse. Note that the use of "pulse" in this document does not require a square pulse but includes a (continuous or non-continuous) vibration or burst of sound, current, voltage light, or other wave. Said memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3 can be grouped into two parts, the memory structure 502 (including the memory cells) and the peripheral circuitry, including all of the other elements. An important characteristic of a memory circuit is its capacity, which can be increased by increasing the area of the memory die of memory system 500 that is given over to the memory structure 502; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 560, reduced availability of area can limit the available functionalities that can be implemented on-chip. Consequently, a basic trade-off in the design of a memory die for the memory system 500 is the amount of area to devote to the memory structure 502 and the amount of area to devote to the peripheral circuitry.

Another area in which the memory structure 502 and the peripheral circuitry are often at odds is in the processing involved in forming these regions, since these regions often involve differing processing technologies and the trade-off in having differing technologies on a single die. For example, when the memory structure 502 is NAND flash, this is an NMOS structure, while the peripheral circuitry is often CMOS based. For example, elements such sense amplifier circuits, charge pumps, logic elements in a state machine, and other peripheral circuitry in system control logic 560 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3 onto separately formed dies that are then bonded together. More specifically, the memory structure 502 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more die, such as two memory die and one peripheral circuitry die, for example.

Figure 4:
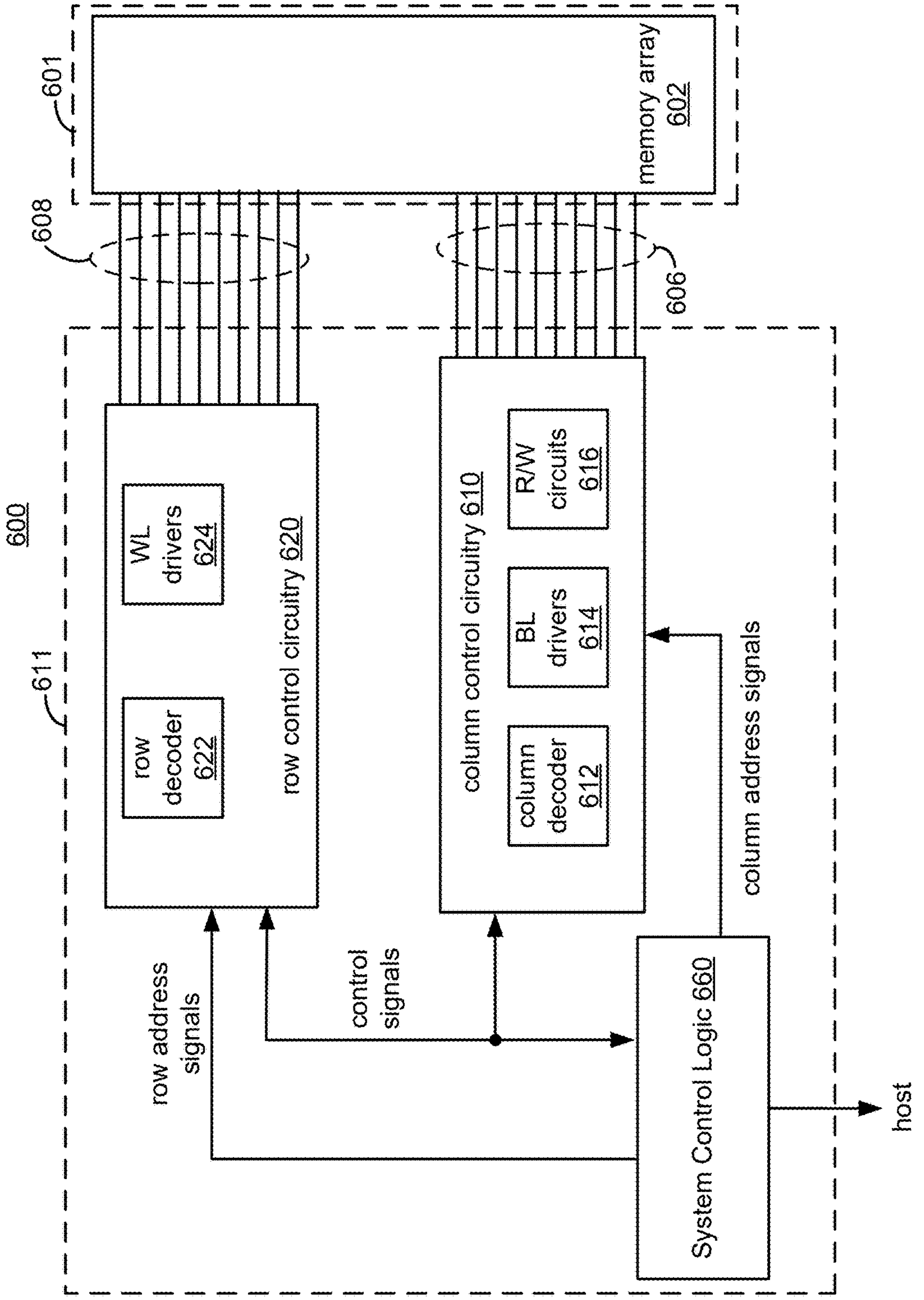
FIG. 4 is a block diagram of one embodiment of an integrated memory assembly.

FIG. 4 shows an alternative arrangement to that of FIG. 3, which may be implemented using wafer-to-wafer bonding to provide a bonded die pair for integrated memory assembly 600. FIG. 4 shows an example of the peripheral circuitry, including control circuits, formed in a peripheral circuit or control die 611 coupled to memory structure 602 formed in memory die 601. As with 502 of FIG. 3, the memory die 601 can include multiple independently accessible arrays or “tiles”. Common components are labelled similarly to FIG. 3 (e.g., 502 is now 602, 510 is now 610, and so on). It can be seen that system control logic 660, row control circuitry 620, and column control circuitry 610 (which may be formed by a CMOS process) are located in control die 611. Additional elements, such as functionalities from controller 102, can also be moved into the control die 611. System control logic 660, row control circuitry 620, and column control circuitry 610 may be formed by a common process (e.g., CMOS process), so that adding elements and functionalities more typically found on a memory controller 102 may require few or no additional process steps (i.e., the same process steps used to fabricate controller 102 may also be used to fabricate system control logic 660, row control circuitry 620, and column control circuitry 610). Thus, while moving such circuits from a die such as memory die of memory system 500 may reduce the number of steps needed to fabricate such a die, adding such circuits to a die such as control die 611 may not require any additional process steps.

FIG. 4 shows column control circuitry 610 on the control die 611 coupled to memory structure 602 on the memory die 601 through electrical paths 606. For example, electrical paths 606 may provide electrical connection between column decoder 612, driver circuitry 614, and R/W circuits 616 and bit lines of memory structure 602. Electrical paths may extend from column control circuitry 610 in control die 611 through pads on control die 611 that are bonded to corresponding pads of the memory die 601, which are connected to bit lines of memory structure 602. Each bit line of memory structure 602 may have a corresponding electrical path in electrical paths 606, including a pair of bonded pads, which connects to column control circuitry 610. Similarly, row control circuitry 620, including row decoder 622, array drivers 624, and block select 626, are coupled to memory structure 602 through electrical paths 608. Each electrical path 608 may correspond to a word line, dummy word line, or select gate line. Additional electrical paths may also be provided between control die 611 and memory die 601.

Relative to FIG. 3, the on-die control circuits of FIG. 4 can include addition functionalities within its logic elements, both more general capabilities than are typically found in the memory controller 102 and some CPU capabilities, but also application specific features.

In the following, system control logic 560/660, column control circuitry 510/610, row control circuitry 520/620, and/or controller 102 (or equivalently functioned circuits), in combination with all or a subset of the other circuits depicted in FIG. 3 or on the control die 611 in FIG. 4 can be considered part of the one or more control circuits that perform the functions described herein. The control circuits can include hardware only or a combination of hardware and software (including firmware). For example, a controller programmed by firmware to perform the functions described herein is one example of a control circuit. A control circuit can include a processor, FGA, ASIC, integrated circuit, or other type of circuit.

In the following discussion, the memory array 502/602 of FIGS. 3 and 4 will mainly be discussed in the context of a cross-point architecture, although much of the discussion can be applied more generally. The following discussion will mainly focus on embodiments based on a cross-point architecture using MRAM memory cells, although much of the discussion can be applied more generally to nonvolatile memory cells.

Figure 5:
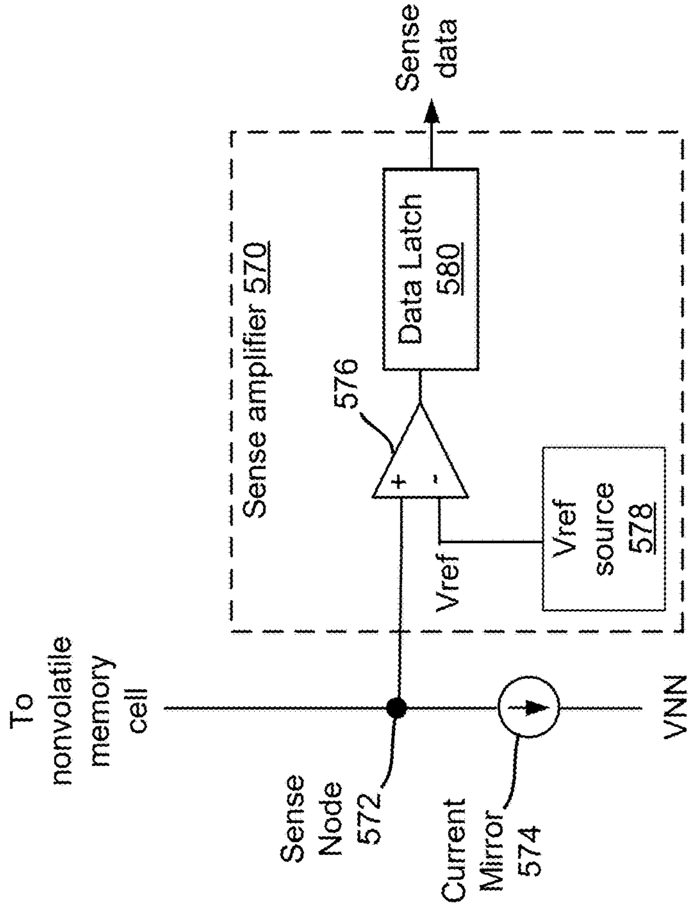
FIG. 5 shows an example of a sense amplifier.

FIG. 5 shows an example of a sense amplifier 570 (e.g., in read/write circuits 516 or 616). FIG. 5 shows a sense node 572 that may be connected to a selected nonvolatile memory cell (e.g., through a selected bit line that may be selected by column decoder 512 or 612). A current mirror 574 connected to a supply voltage, VNN, controls current through the selected nonvolatile memory cell during sensing. Sense amplifier 570 includes comparator 576 which receives a voltage from sense node 572 and compares it with a reference voltage (Vref) from a reference voltage source 578. For example, comparator 576 may generate a digital output (logic 1 or 0) depending on whether voltage at sense node 572 is above or below the reference voltage. The digital output from comparator 576 is latched in data latch 580 and output as sense data.

Figure 6:
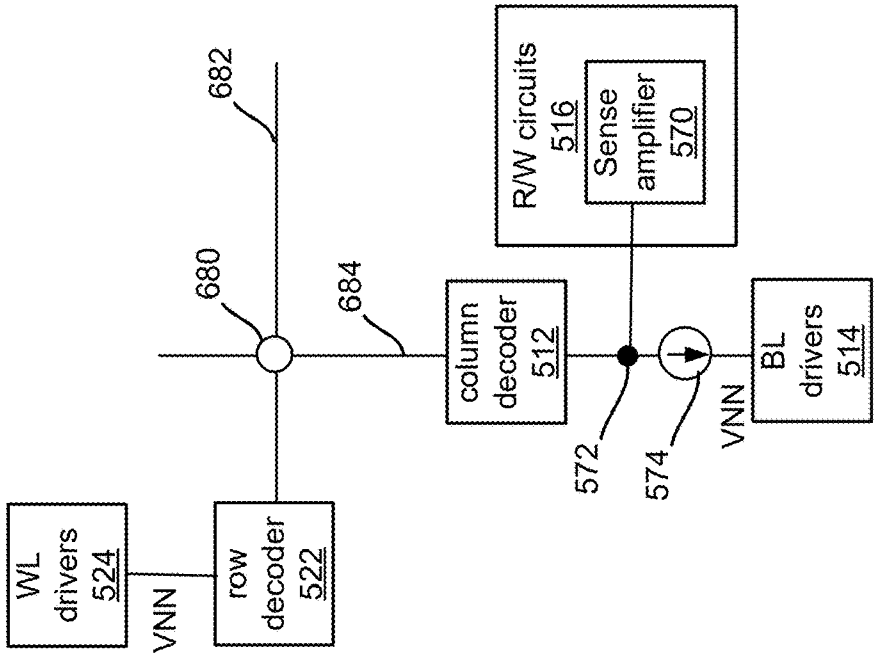
FIG. 6 shows an example of a memory access operation (read operation).

FIG. 6 illustrates a read operation directed to a selected memory cell 680, which is at the intersection of selected word line 682 and selected bit line 684 (e.g., in structure 502/602). Word line drivers 542 generate a first supply voltage, VPP (e.g., a positive voltage), which is then applied to selected word line 682 by row decoder 522. Column decoder 512 selects selected bit line 684 and connects it to sense node 572, where voltage is sensed by sense amplifier 570 as current flows through current mirror, which receives a second supply voltage VNN (e.g., a negative voltage) from bit line drivers 514. Sense amplifier 570 may sense the state of selected memory cell 680 from the voltage at sense node 572 while a predetermined current from current mirror 574 flows through selected memory cell 680.

Figure 7A:
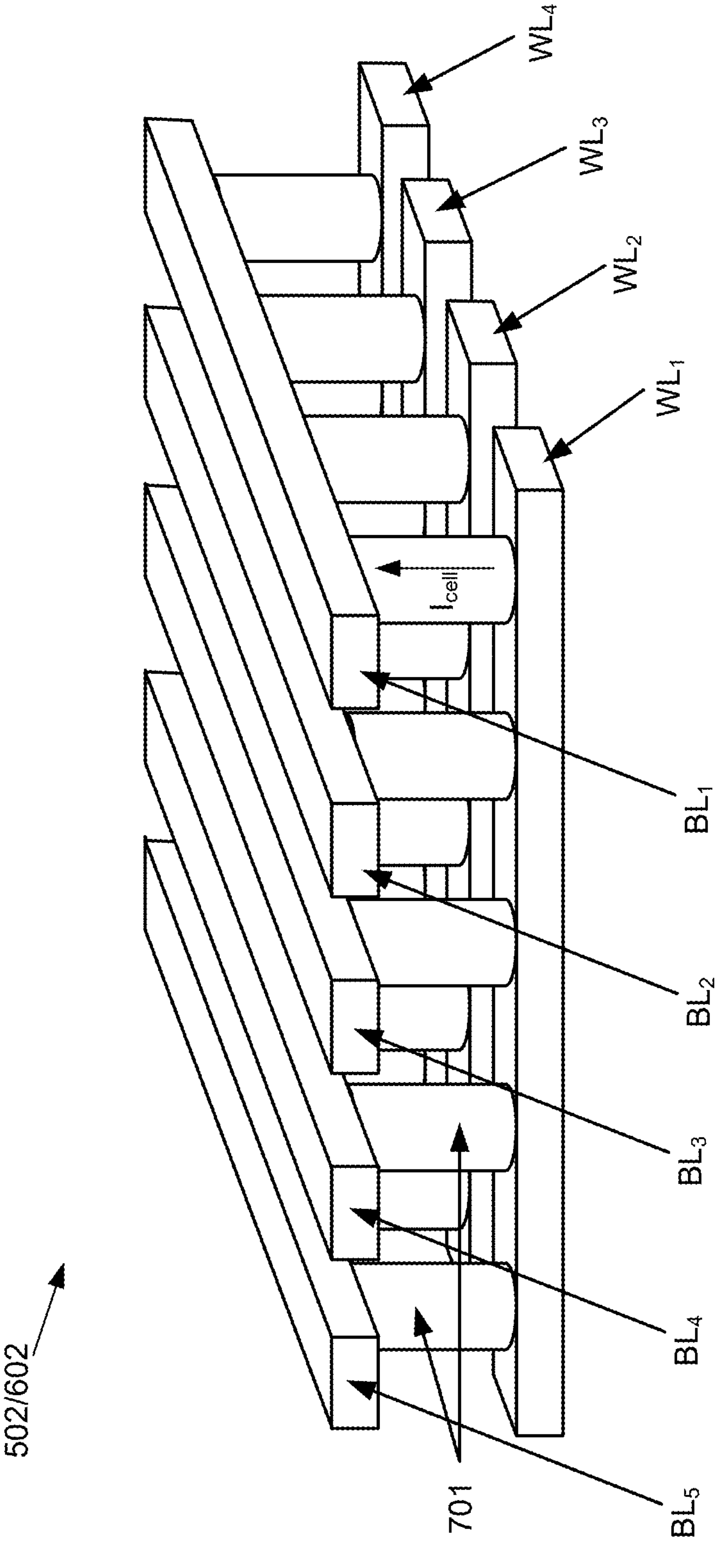
FIG. 7A depicts one embodiment of a portion of a memory array that forms a cross-point architecture in an oblique view.

FIG. 7A depicts one embodiment of a portion of a memory array that forms a cross-point architecture in an oblique view. Memory array 502/602 of FIG. 7A is one example of an implementation for memory array 502 in FIG. 3 or 602 in FIG. 4, where a memory die can include multiple such array structures. The bit lines $BL_1$-$BL_5$ are arranged in a first direction (e.g., "bit line direction" represented as running into the page) relative to an underlying substrate (not shown) of the die and the word lines $WL_1$-$WL_5$ are arranged in a second direction (e.g., "word line direction") perpendicular to the first direction (across the page). FIG. 7A is an example of a horizontal cross-point structure in which word lines $WL_1$-$WL_5$ and $BL_1$-$BL_5$ both run in a horizontal direction relative to the substrate, while the memory cells, two of which are indicated at 701, are oriented so that the current through a memory cell (such as shown at $I_{cell}$) runs in the vertical direction. In a memory array with additional layers of memory cells, such as discussed below with respect to FIG. 7D, there would be corresponding additional layers of bit lines and word lines.

As depicted in FIG. 7A, memory array 502/602 includes a plurality of memory cells 701. The memory cells 701 may include re-writeable memory cells, such as can be implemented using ReRAM, MRAM, PCM, FeRAM, or other material with a programmable resistance. The current in the memory cells of the first memory level is shown as flowing upward as indicated by arrow $I_{cell}$, but current can flow in either direction, as is discussed in more detail in the following.

Figure 7B:
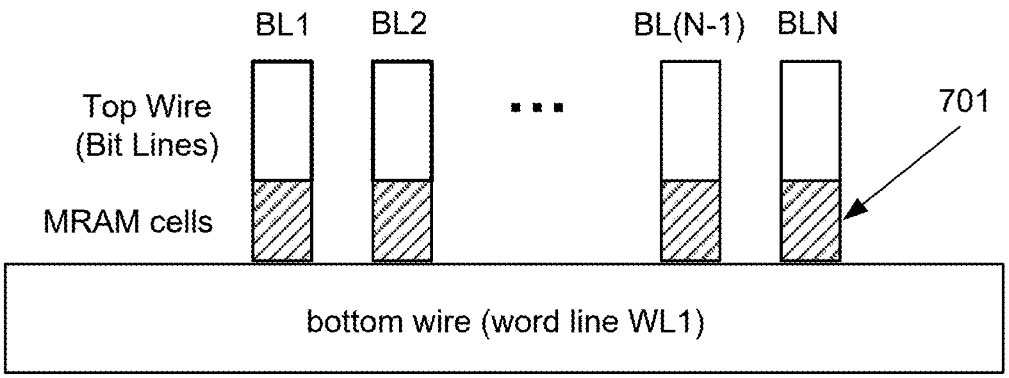
FIGS. 7B and 7C respectively present side and top views of the cross-point structure in FIG. 7A.
Figure 7C:
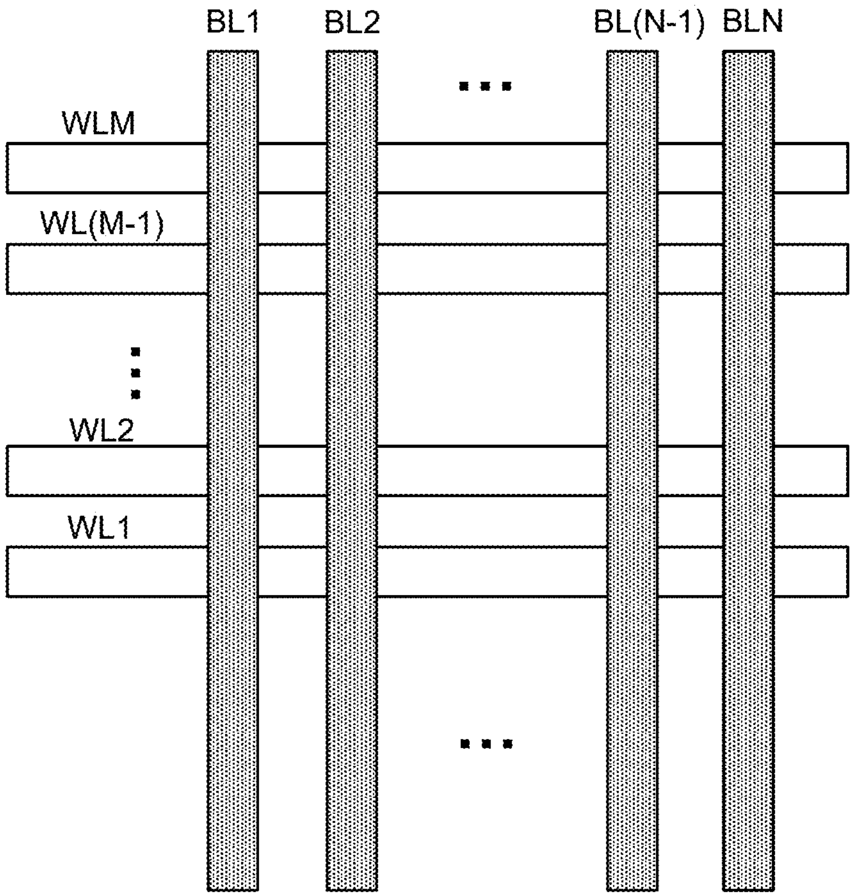

FIGS. 7B and 7C respectively present side and top views of the cross-point structure in FIG. 7A. The sideview of FIG. 7B shows one bottom wire, or word line, $WL_1$ and the top wires, or bit lines, $BL_1$-$BL_n$. At the cross-point between each top wire and bottom wire is an MRAM memory cell, although PCM, FeRAM, ReRAM, or other technologies can be used. FIG. 7C is a top view illustrating the cross-point structure for M bottom wires $WL_1$-$WL_M$ and N top wires $BL_1$-$BL_N$. In a binary embodiment, the MRAM cell at each cross-point can be programmed into one of two resistance states: high and low. More detail on embodiments for an MRAM memory cell design and techniques for their programming are given below.

The cross-point array of FIG. 7A illustrates an embodiment with one layer (one story) of word lines and bits lines, with the MRAM or other memory cells sited at the intersection of the two sets of conducting lines. To increase the storage density of a memory die, multiple layers (stories) of such memory cells and conductive lines can be formed. A 2-layer (2-story) example is illustrated in FIG. 7D.

Figure 7D:
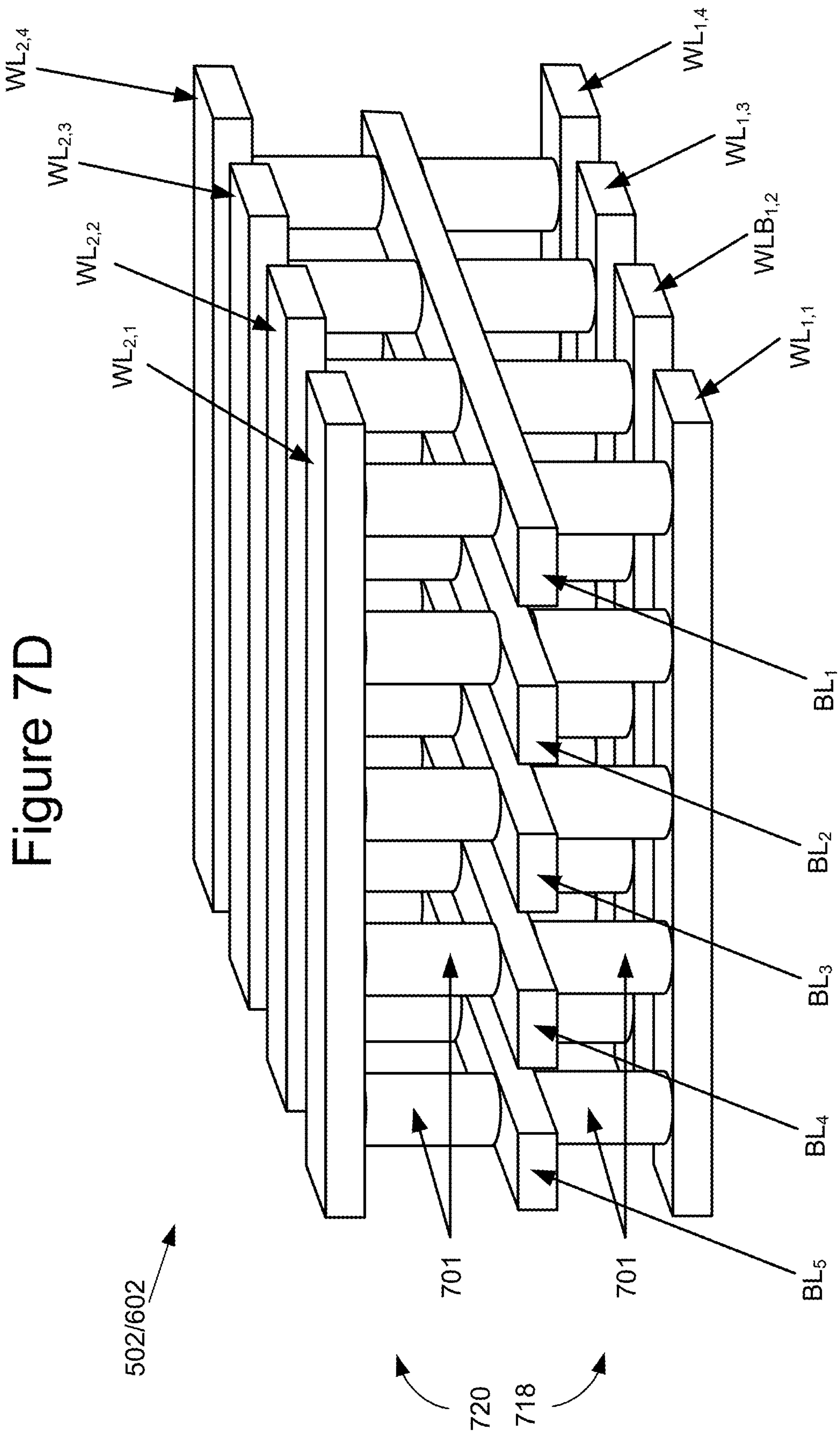
FIG. 7D depicts an embodiment of a portion of a two level memory array that forms a cross-point architecture in an oblique view.

FIG. 7D depicts an embodiment of a portion of a two level (two story) memory array that forms a cross-point architecture in an oblique view. As in FIG. 7A, FIG. 7D shows a first layer 718 (first story) of memory cells 701 of an array 502/602 connected at the cross-points of the first layer of word lines $WL_{1,1}$-$WL_{1,4}$ and bit lines $BL_1$-$BL_5$. A second layer (second story) of memory cells 720 is formed above the bit lines $BL_1$-$BL_5$ and between these bit lines and a second set of word lines $WL_{2,1}$-$WL_{2,4}$. Although FIG. 7D shows two layers (stories), 718 and 720, of memory cells, the structure can be extended upward through additional alternating layers of word lines and bit lines. Depending on the embodiment, the word lines and bit lines of the array of FIG. 7D can be biased for read or program operations such that current in each layer flows from the word line layer to the bit line layer or the other way around.

The use of a cross-point architecture allows for arrays with a small footprint and several such arrays can be formed on a single die. The memory cells formed at each cross-point can be a resistive type of memory cell, where data values are encoded as different resistance levels. Depending on the embodiment, the memory cells can be binary valued, having either a low resistance state or a high resistance state, or multi-level cells (MLCs) that can have additional resistance intermediate to the low resistance state and high resistance state. The cross-point arrays described here can be used as the memory die 292 of FIG. 4, to replace local memory 106, or both.

Figure 8:
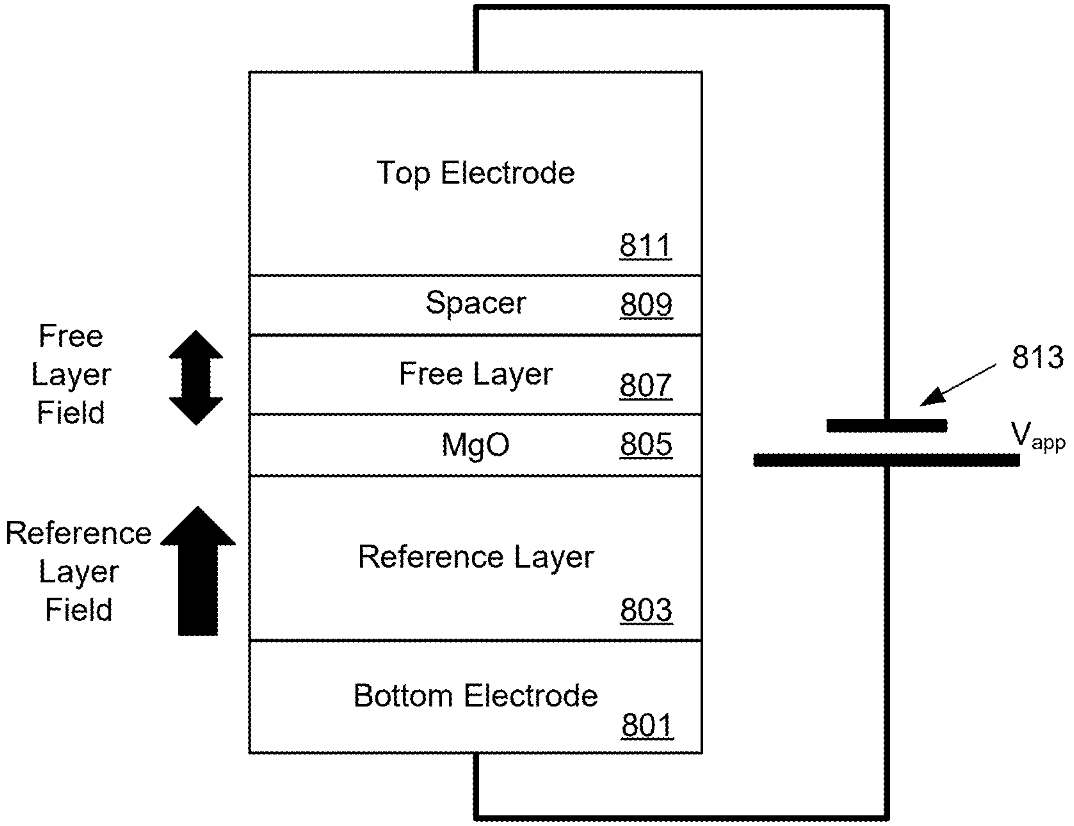
FIG. 8 illustrates an embodiment for the structure of an MRAM memory cell.

FIG. 8 illustrates an embodiment for the structure of an MRAM memory cell. A voltage being applied across the memory cell, between the memory cell's corresponding word line and bit line, is represented as a voltage source $V_{app}$ 813. The memory cell includes a bottom electrode 801, a pair of magnetic layers (reference layer 803 and free layer 807) separated by a separation or tunneling layer of, in this example, magnesium oxide (MgO) 805, and then a top electrode 811 separated from the free layer 807 by a spacer 809. The state of the memory cell is based on the relative orientation of the magnetizations of the reference layer 803 and the free layer 807: if the two layers are magnetized in the same direction, the memory cell will be in a parallel (P) low resistance state (LRS); and if they have the opposite orientation, the memory cell will be in an anti-parallel (AP) high resistance state (HRS). An MLC embodiment would include additional intermediate states. The orientation of the reference layer 803 is fixed and, in the example of FIG. 15, is oriented upward. Reference layer 803 is also known as a fixed layer or pinned layer.

Data is written to an MRAM memory cell by programming the free layer 807 to either have the same orientation or opposite orientation. The reference layer 803 is formed so that it will maintain its orientation when programming the free layer 807. The reference layer 803 can have a more complicated design that includes synthetic anti-ferromagnetic layers and additional reference layers. For simplicity, the figures and discussion omit these additional layers and focus only on the fixed magnetic layer primarily responsible for tunneling magnetoresistance in the cell.

Figure 9:
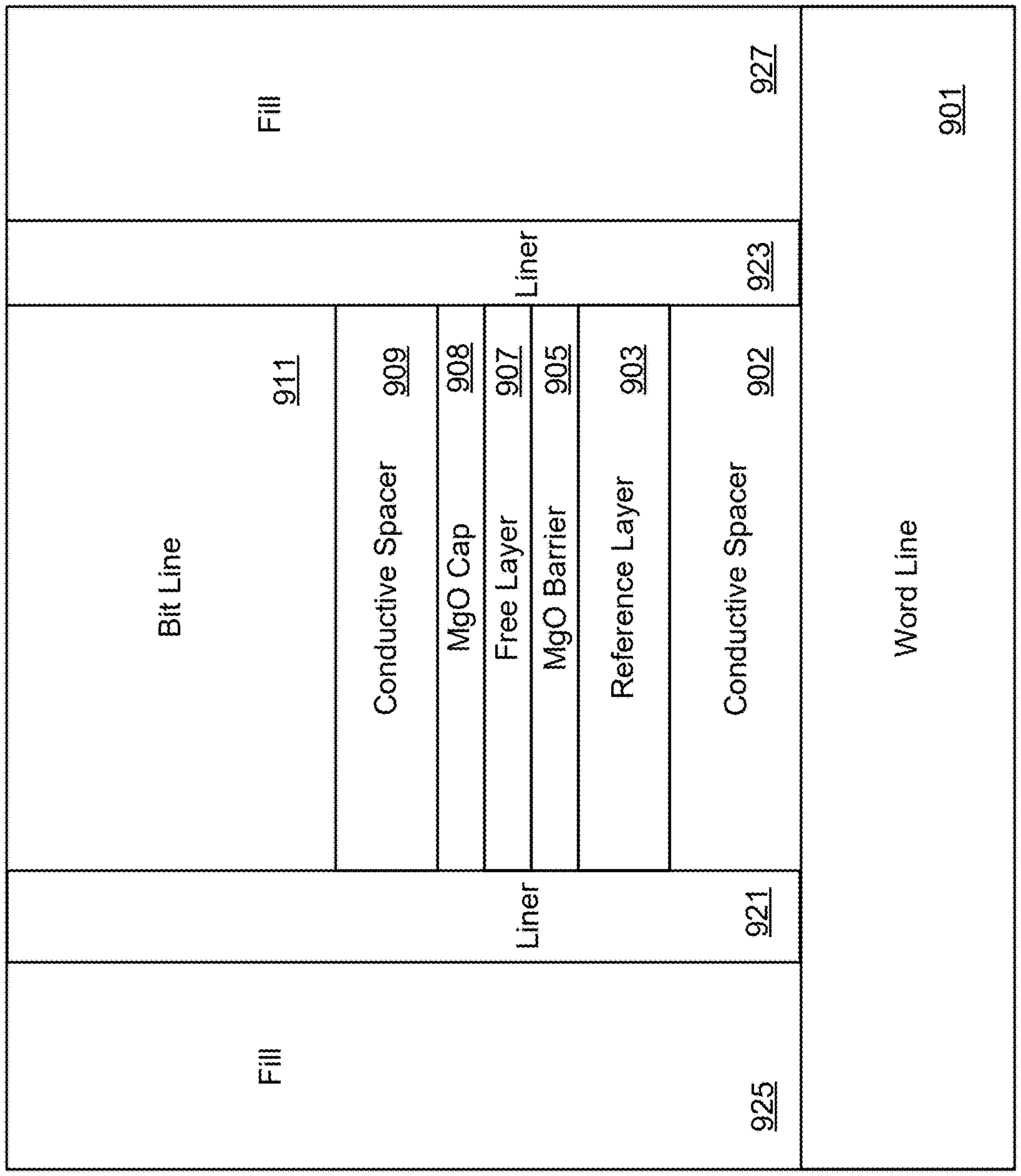
FIG. 9 illustrates an embodiment for an MRAM memory cell design as it would be implemented in a cross-point array in more detail.

FIG. 9 illustrates an embodiment for an MRAM memory cell design as it may be implemented in a cross-point array in more detail. When placed in a cross-point array, the top and bottom electrodes of the MRAM memory cells will be two of the adjacent layers of wires of the array, for example the top and bottom wires of the two level or two deck array. In the embodiment shown here, the bottom electrode is the word line 901 and the top electrode is the bit line 911 of the memory cell, but these can be reversed in some embodiments by reversing the orientation of the memory element. Between the word line 901 and bit line 911 are the reference layer 903 and free layer 907, which are again separated MgO barrier 905. In the embodiment shown in FIG. 9, a MgO cap 908 is also formed on top of the free layer 907 and a conductive spacer 909 is formed between the bit line 911 and the MgO cap 908. The reference layer 903 is separated from the word line 901 by another conductive spacer 902. On either side of the memory cell structure is a liner 921 and 923, where these can be part of the same structure, but appear separate in the cross-section of FIG. 9. To either side of the liner 921, 923 is shown some of fill material 925, 927 used to fill in the otherwise empty regions of the cross-point structure.

With respect to the free layer 907, embodiments include CoFe or CoFeB Alloy with a thickness on the order ~1-2 nm, where an Ir layer can be interspersed in the free layer close to MgO barrier 905 and the free layer 907 can be doped with Ta, W, or Mo. Embodiments for the reference layer 903 can include a bilayer of CoFeB and CoPt multilayer coupled with an Ir or Ru spacer 902. The MgO cap 908 is optional but can be used to increase anisotropy of free layer 907. The conductive spacers can be conductive metals such as Ta, W, Ru, CN, TiN, and TaN, among others.

To sense a data state stored in an MRAM, a voltage is applied across the memory cell as represented by $V_{app}$ to determine its resistance state. For reading an MRAM memory cell, the voltage differential $V_{app}$ can be applied in either direction; however, MRAM memory cells have a directionality and, because of this, in some circumstances there is a preference for reading in one direction over the other. For example, the optimum current amplitude to write a bit into the AP (high resistance state, HRS) may be greater than that to write to the P (low resistance state) by 50% or more, so bit error rate (read disturb) is less probable if reading to AP (2AP). Some of these circumstances and the resultant directionality of a read are discussed below. The directionality of the biasing particularly enters into some embodiments for the programming of MRAM memory cells.

Figure 10A:
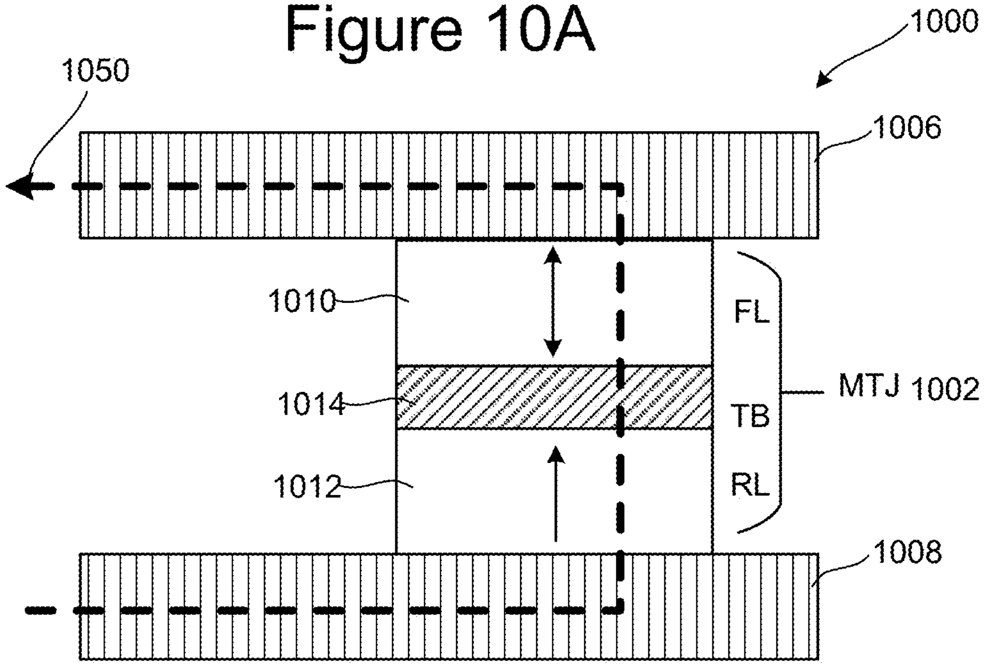
FIGS. 10A and 10B illustrate the writing of an MRAM memory cell by use of a spin torque transfer (STT) mechanism.
Figure 10B:
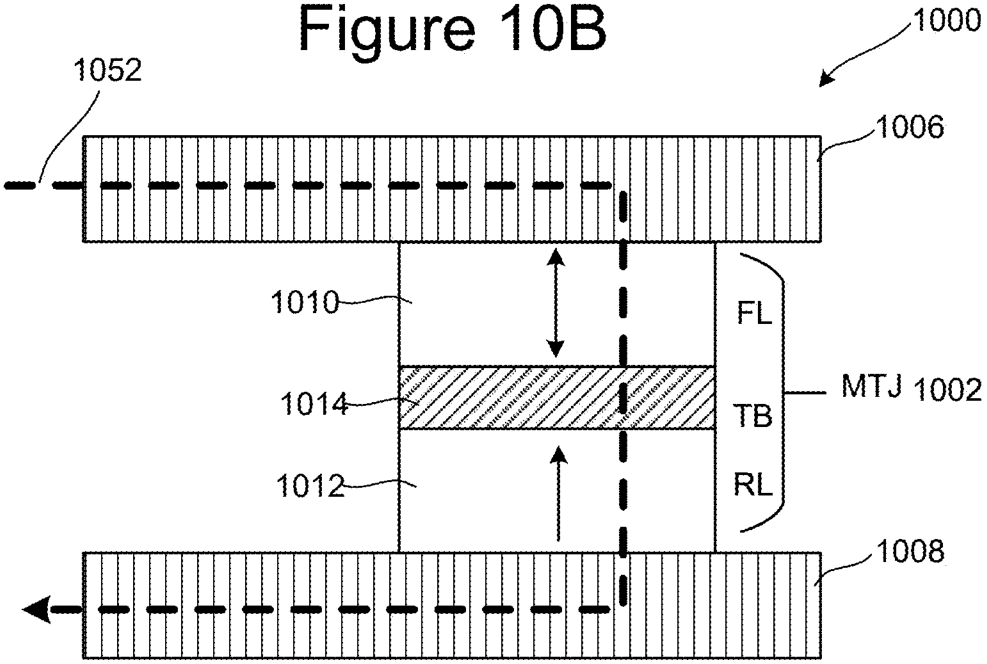

The following discussion will mainly be discussed with respect to a perpendicular spin transfer torque MRAM memory cell, where the free layer 807/907 of FIGS. 8 and 9 comprises a switchable direction of magnetization that is perpendicular to the plane of the free layer. Spin transfer torque ("STT") is an effect in which the orientation of a magnetic layer in a magnetic tunnel junction can be modified using a spin-polarized current. Charge carriers (such as electrons) have a property known as spin which is a small quantity of angular momentum intrinsic to the carrier. An electric current is generally unpolarized (e.g., consisting of 50% spin-up and 50% spin-down electrons). A spin polarized current is one with more electrons of either spin (e.g., a majority of spin-up electrons or a majority of spin-down electrons). By passing a current through a thick magnetic layer (the reference layer), a spin-polarized current can be produced. If this spin-polarized current is directed into a second magnetic layer (the free layer), angular momentum can be transferred to this second magnetic layer, changing the direction of magnetization of the second magnetic layer. This is referred to as spin transfer torque. FIGS. 10A and 10B illustrate the use of spin transfer torque to program or write to MRAM memory. Spin transfer torque magnetic random access memory (STT MRAM) has the advantages of lower power consumption and better scalability over MRAM variations such as toggle MRAM. Compared to other MRAM implementations, the STT switching technique requires relatively low power, virtually eliminates the problem of adjacent bit disturbs, and has more favorable scaling for higher memory cell densities (reduced MRAM cell size). The latter issue also favors STT MRAM where the free and reference layer magnetizations are orientated perpendicular to the film plane, rather than in-plane.

As the STT phenomenon is more easily described in terms of electron behavior, FIGS. 10A and 10B and their discussion are given in terms of electron current, where the direction of the write current is defined as the direction of the electron flow. Therefore, the term write current in reference to FIGS. 10A and 10B refers to an electron current. As electrons are negatively charged, the electron current will be in the opposite direction from the conventionally defined current, so that an electron current will flow from a lower voltage level towards a higher voltage level instead the conventional current flow of from a higher voltage level to a lower voltage level.

FIGS. 10A and 10B illustrate the writing and reading of an MRAM memory cell using the STT mechanism, depicting a simplified schematic representation of an example of an STT-switching MRAM memory cell 1000 in which both the reference and free layer magnetization are in the perpendicular direction. Memory cell 1000 includes a magnetic tunnel junction (MTJ) 1002 comprising an upper ferromagnetic layer 1010, a lower ferromagnetic layer 1012, and a tunnel barrier 1014 (TB) as an insulating layer between the two ferromagnetic layers. In this example, upper ferromagnetic layer 1010 is the free layer FL and the direction of its magnetization can be switched. Lower ferromagnetic layer 1012 is the reference (or fixed) layer RL and the direction of its magnetization cannot be switched. When the magnetization in free layer 1010 is parallel to the magnetization in reference layer RL 1012, the resistance across the memory cell 1000 is relatively low. When the magnetization in free layer FL 1010 is anti-parallel to the magnetization in reference layer RL 1012, the resistance across memory cell 1000 is relatively high. The data ("0" or "1") in memory cell 1000 is read by measuring the resistance of the memory cell 1000. In this regard, electrical conductors 1006/1008 attached to memory cell 1000 are utilized to read the MRAM data. By design, both the parallel and antiparallel configurations remain stable in the quiescent state and/or during a read operation (at sufficiently low read current).

For both the reference layer RL 1012 and free layer FL 1010, the direction of magnetization is in a perpendicular direction (i.e. perpendicular to the plane defined by the free layer and perpendicular to the plane defined by the reference layer). FIGS. 10A and 10B show the direction of magnetization of reference layer RL 1012 as up and the direction of magnetization of free layer FL 1010 as switchable between up and down, which is again perpendicular to the plane.

In one embodiment, tunnel barrier 1014 is made of Magnesium Oxide (MgO); however, other materials can also be used. Free layer 1010 is a ferromagnetic metal that possess the ability to change/switch its direction of magnetization. Multilayers based on transition metals like Co, Fe and their alloys can be used to form free layer 1010. In one embodiment, free layer 1010 comprises an alloy of Cobalt, Iron and Boron. Reference layer 1012 can be many different types of materials including (but not limited to) multiple layers of Cobalt and Platinum and/or an alloy of Cobalt and Iron.

To "set" the MRAM memory cell bit value (i.e., choose the direction of the free layer magnetization), an electron write current 1050 is applied from conductor 1008 to conductor 1006, as depicted in FIG. 10A. To generate the electron write current 1050, the top conductor 1006 is place at a higher voltage level than bottom conductor 1008, due to the negative charge of the electron. The electrons in the electron write current 1050 become spin-polarized as they pass through reference layer 1012 because reference layer 1012 is a ferromagnetic metal. When the spin-polarized electrons tunnel across the tunnel barrier 1014, conservation of angular momentum can result in the imparting of a spin transfer torque on both free layer 1010 and reference layer 1012, but this torque is inadequate (by design) to affect the magnetization direction of the reference layer 1012. Contrastingly, this spin transfer torque is (by design) sufficient to switch the magnetization orientation in the free layer 1010 to become parallel (P) to that of the reference layer 1012 if the initial magnetization orientation of the free layer 1010 was anti-parallel (AP) to the reference layer 1012, referred to as an anti-parallel-to-parallel (AP2P) write. The parallel magnetizations will then remain stable before and after such electron write current is turned off.

In contrast, if free layer 1010 and reference layer 1012 magnetizations are initially parallel, the direction of magnetization of free layer 1010 can be switched to become antiparallel to the reference layer 1012 by application of an electron write current of opposite direction to the aforementioned case. For example, electron write current 1052 is applied from conductor 1006 to conductor 1008, as depicted in FIG. 10B, by placing the higher voltage level on the lower conductor 1008. This will write a free layer 1010 in a P state to an AP state, referred to as a parallel-to-anti-parallel (P2AP) write. Thus, by way of the same STT physics, the direction of the magnetization of free layer 1010 can be deterministically set into either of two stable orientations by judicious choice of the electron write current direction (polarity).

The data ("0" or "1") in memory cell 1000 can be read by measuring the resistance of the memory cell 1000. Low resistance typically represents a "0" bit and high resistance typically represents a "1" bit, although sometimes the alternate convention occurs. A read current can being applied across the memory cell (e.g., across the magnetic tunnel junction 1002) by applying an electron read current from conductor 1008 to conductor 1006, flowing as shown for 1050 in FIG. 10A (the "AP2P direction"); alternatively, the electron read current can be applied from conductor 1006 to conductor 1008, flowing as shown for 1052 in FIG. 10B (the "P2AP direction"). In a read operation, if the electron write current is too high, this can disturb data stored in a memory cell and change its state. For example, if electron read current uses the P2AP direction of FIG. 10B, too high of a current or voltage level can switch any memory cells in the low resistance P state into the high resistance AP state. Consequently, although the MRAM memory cell can be read in either direction, the directional nature of the write operation may make one read direction preferable over the other in various embodiments as the P2AP direction since more current is required to write the bit in that direction.

Although the discussion of FIGS. 10A and 10B was in the context of electron current for the read and write currents, the subsequent discussion will be in the context of conventional current unless otherwise specified.

Whether to read or write selected memory cells in the array structures of FIGS. 7A-7D, the bit line and word line corresponding to a selected memory cell are biased to place a voltage across the selected memory cell and induce the flow of electrons as illustrated with respect to FIG. 10A or 10B. This will also apply a voltage across non-selected memory cells of the array, which can induce currents in non-selected memory cells. Although this wasted power consumption can be mitigated to some degree by designing the memory cells to have relatively high resistance levels for both high and low resistance states, this will still result in increased current and power consumption as well as placing additional design constraints on the design of the memory cells and the array.

One approach to address this unwanted current leakage is to place a selector element in series with each MRAM or other resistive (e.g., ReRAM, PCM, and FeRAM) memory cell. For example, a select transistor can be placed in series with each resistive memory cell element in FIGS. 7A-7D so that memory cells 701 are now a composite of a selector and a programmable resistance. Use of a transistor, however, requires the introduction of additional control lines to be able to turn on the corresponding transistor of a selected memory cell. Additionally, transistors will often not scale in the same manner as the resistive memory element, so that as memory arrays move to smaller sizes the use of transistor based selectors can be a limiting factor.

An alternate approach to selector elements is the use of a threshold switching selector device in series with the programmable resistive element. A threshold switching selector has a high resistance (in an off or non-conductive state) when it is biased to a voltage lower than its threshold voltage, and a low resistance (in an on or conductive state) when it is biased to a voltage higher than its threshold voltage. The threshold switching selector remains on until its current is lowered below a holding current, or the voltage is lowered below a holding voltage. When this occurs, the threshold switching selector returns to the off state. Accordingly, to program a memory cell at a cross-point, a voltage or current is applied which is sufficient to turn on the associated threshold switching selector and set or reset the memory cell; and to read a memory cell, the threshold switching selector similarly must be activated by being turned on before the resistance state of the memory cell can be determined. One set of examples for a threshold switching selector is an ovonic threshold switching material of an Ovonic Threshold Switch (OTS).

Figure 11:
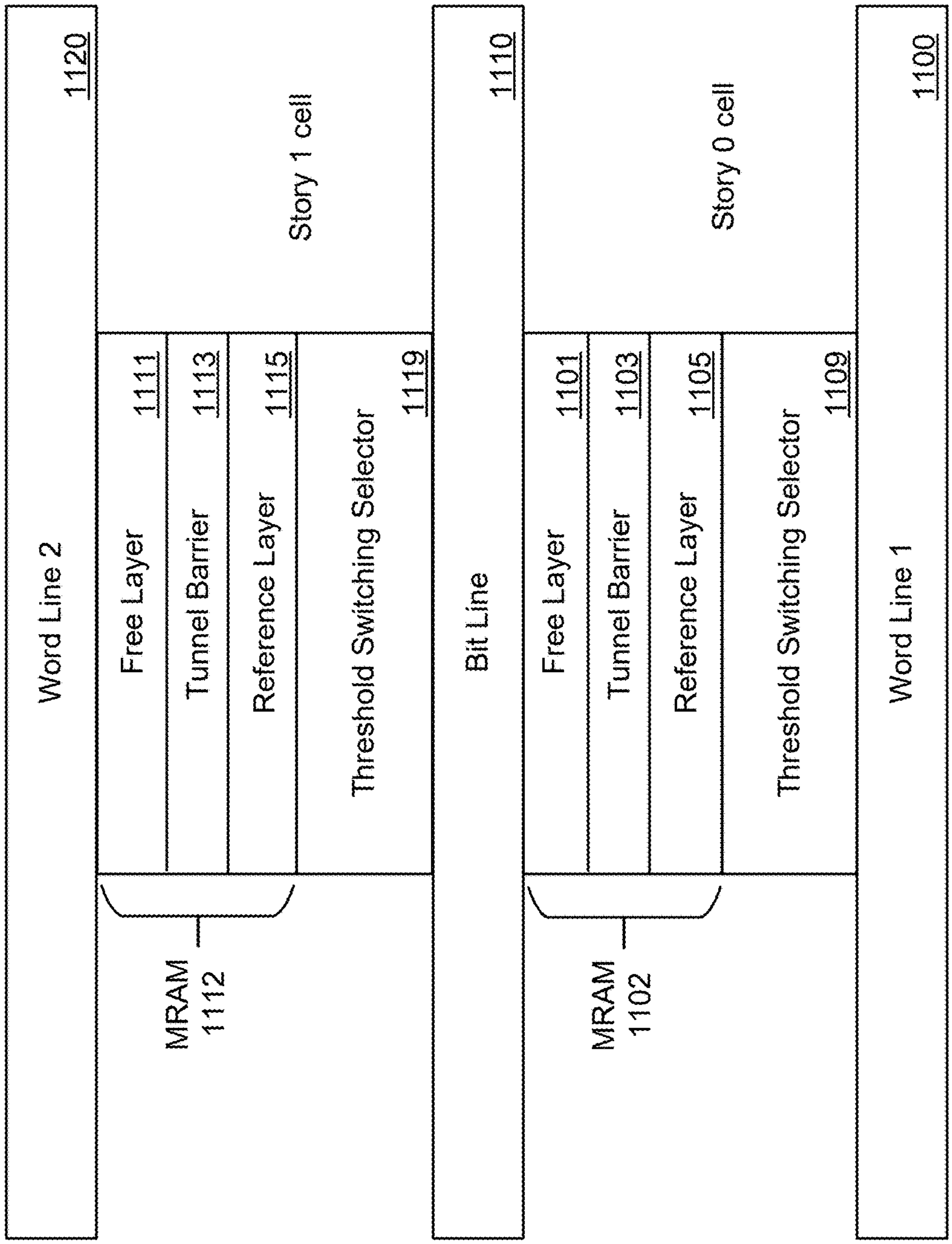
FIG. 11 illustrates an embodiment that includes threshold switching selectors in an MRAM memory array having a cross-point architecture.

FIG. 11 shows an embodiment that incorporates threshold switching selectors into an MRAM memory array having a cross-point architecture. The example of FIG. 11 shows two MRAM cells in a two layer (2-story) cross-point array, such as shown in FIG. 7D, but in a side view. FIG. 11 shows a lower first conducting line of word line 1 1100 (in a first or lower word line layer), an upper first conducting line of word line 2 1120 (in a second or upper word line layer), and an intermediate conducting line of bit line 1110 (in a bit line layer). In FIG. 11, all of these lines are shown running left to right across the page for ease of presentation. In a cross-point array they would be more accurately represented as in the oblique view of FIG. 7D where the word lines, or first conducting lines or wires, run in one direction parallel to the surface of the underlying substrate and the bit lines, or second conducting lines or wires, run in a second direction parallel to the surface to the substrate that is largely orthogonal to the first direction. The MRAM memory cells are also represented in a simplified form, showing only the reference layer, free layer, and the intermediate tunnel barrier, but in an actual implementation would typically include the additional structure described above with respect to FIG. 9.

An MRAM device 1102 including free layer 1101, tunnel barrier 1103, and reference layer 1105 is formed above the threshold switching selector 1109, where this series combination of the MRAM device 1102 and the threshold switching selector 1109 together form the Story 0 cell between the bit line 1110 and word line 1 1100. The series combination of the MRAM device 1102 and the threshold switching selector 1109 operate largely as described above with respect to FIGS. 10A and 10B when the threshold switching selector 1109 is turned on, aside from some voltage drop across the threshold switching selector 1109. Initially, though, the threshold switching selector 1109 needs to be turned on by applying a voltage above the threshold voltage Vth of the threshold switching selector 1109, and then the biasing current or voltage needs to be maintained high enough above the holding current or holding voltage of the threshold switching selector 1109 so that it stays on during the subsequent read or write operation.

In Story 1, an MRAM device 1112 includes free layer 1111, tunnel barrier 1113, and reference layer 1115 is formed above the threshold switching selector 1119, with the series combination of the MRAM device 1112 and the threshold switching selector 1119 together forming the Story 1 cell between the bit line 1110 and word line 2 1120. The Story 1 cell will operate as for the Story 0 cell, although the lower conductor now corresponds to a bit line 1110 and the upper conductor is now a word line, word line 2 1120.

In the embodiment of FIG. 11, the threshold switching selector 1109/1119 (selector) is formed below the MRAM device 1102/1112, so that selector 1109 is in contact with first word line 1100 of the first word line layer and MRAM device 1102 is formed between selector 1109 and bit line 1110. In alternate embodiments the threshold switching selector can be formed above the MRAM device for one or both layers. As discussed with respect to FIGS. 10A and 10B, the MRAM memory cell is directional. In FIG. 11, the MRAM devices 1102 and 1112 have the same orientation, with the free layer 1101/1111 above (relative to the unshown substrate) the reference layer 1105/1115. Forming the stories between the conductive lines with the same structure can have a number of advantages, particularly with respect to processing as each of the two stories, as well as subsequent stories in embodiments with more stories, can be formed according to the same processing sequence when forming a multi-story nonvolatile memory structure.

To either read data from or write data to an MRAM memory cell involves passing a current through the memory cell. In embodiments where a threshold switching selector is placed in series with the MRAM device, before the current can pass through the MRAM device the threshold switching selector needs to be turned on by applying a sufficient voltage across the series combination of the threshold switching selector and the MRAM device.

Figure 12A:
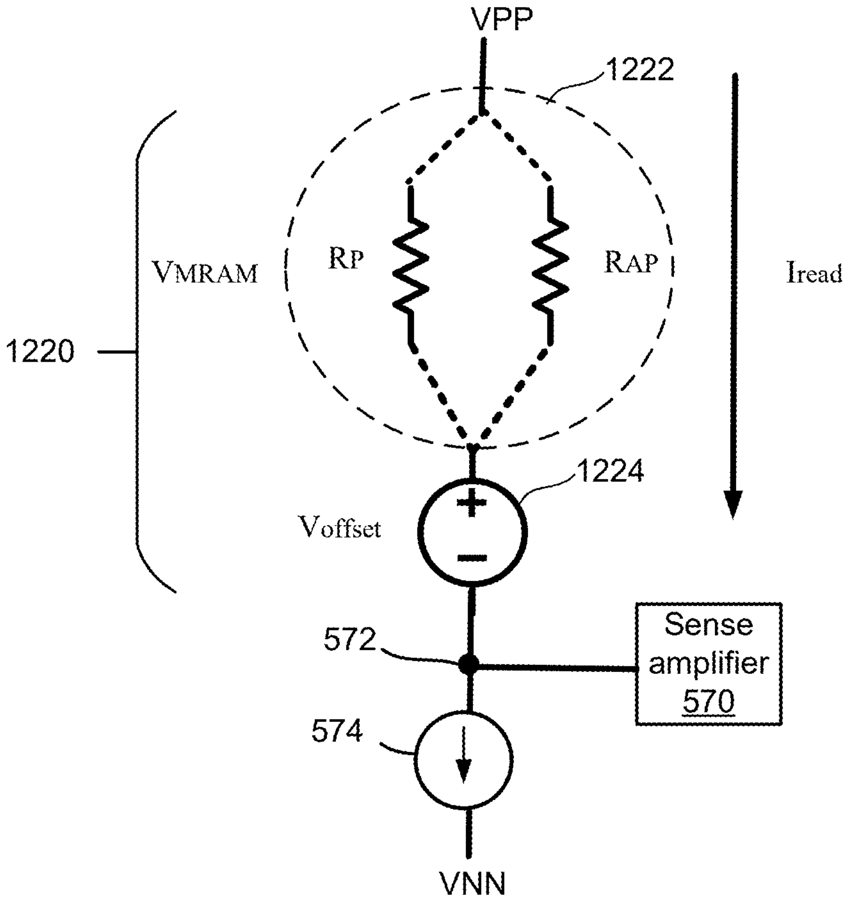
FIGS. 12A-B illustrate reading MRAM cells.

FIG. 12A shows a schematic of an example of reading a nonvolatile memory cell 1220 that includes an MRAM cell 1222 connected in series with a selector 1224. MRAM cell 1222 is illustrated schematically as two resistors having resistances $R_P$ and $R_{AP}$ corresponding to the resistance of MRAM cell 1222 in the parallel and anti-parallel states. A constant current, Iread, is maintained through MRAM cell 1222 during a read (e.g., by a current mirror such as current mirror 574) so that $V_{MRAM}$ may have two different values according to whether MRAM cell 1222 is in the parallel or anti-parallel state (e.g., $V_{MRAM}$=Iread*$R_P$ or $V_{MRAM}$=Iread*$R_{AP}$). Selector 1224 is represented schematically as a voltage source that provides a constant voltage difference, Voffset, when in the ON condition (e.g., once a threshold voltage exceeded). Sense amplifier 570 is connected to sense voltage at sense node 572 (e.g., voltage is different according to the resistance of MRAM cell 1222 and resulting voltage $V_{MRAM}$).

Figure 12B:
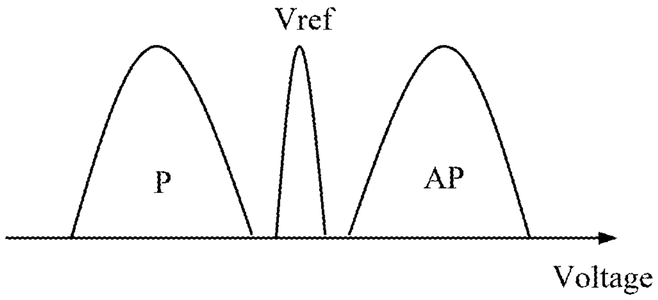

FIG. 12B illustrates voltage distributions that may be compared by a comparator of sense amplifier 570 (e.g., comparator 576) in a sense operation. A first voltage distribution marked "P" (e.g., at sense node 572) corresponds to MRAM cells in the parallel or "P" state. A second voltage distribution marked "AP" corresponds to MRAM cells in the anti-parallel or "AP" state. Between these distributions is a reference voltage, Vref (e.g., from Vref source 578). By comparing voltage at sense node 572 with reference voltage, Vref, a determination may be made as to which state a MRAM cell is in (e.g. sensed voltage<Vref indicates P state and sensed voltage>Vref indicates AP state).

In nonvolatile memory cells that include a selector connected in series with a MRAM cell, conventional current may flow from the selector side to the MRAM side. In a multi-story nonvolatile memory structure such as shown in FIG. 11, this may cause some differences in accessing nonvolatile memory cells in different stories.

Figure 13A:
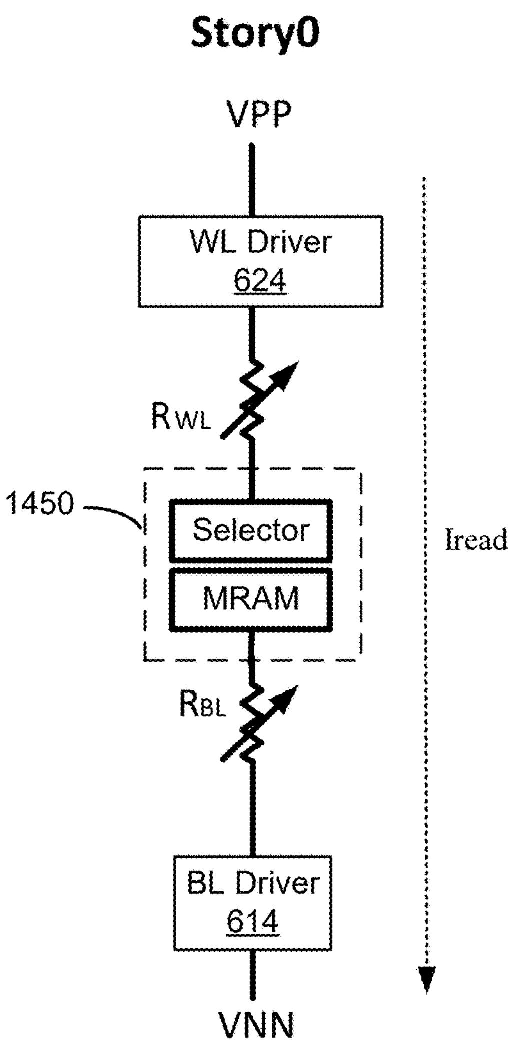
FIGS. 13A-B illustrate current flow in read operations of different stories in a multi-story nonvolatile memory structure.
Figure 13B:
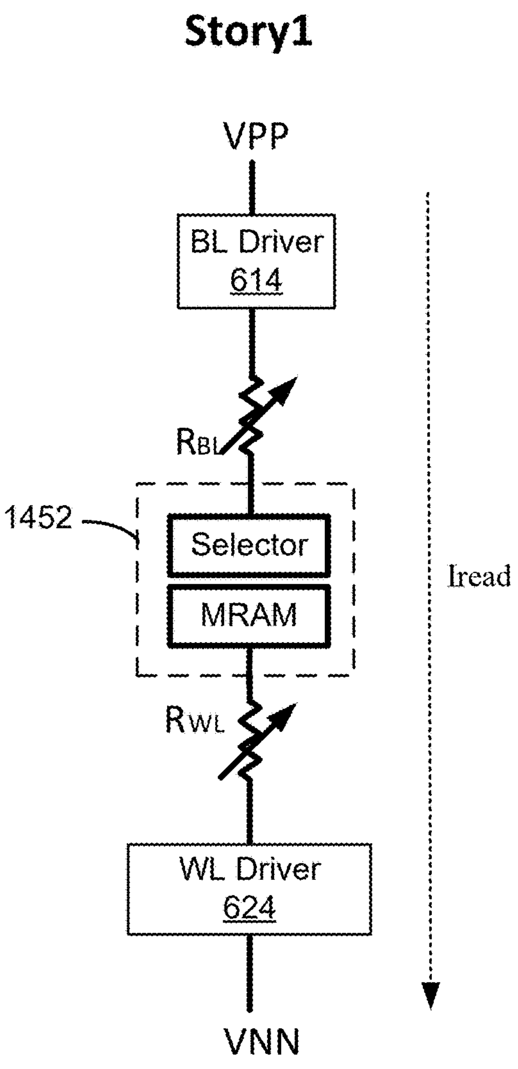

FIGS. 13A-B illustrate differences in accessing nonvolatile memory cells in different stories. In a first story (Story0 of FIG. 13A), current flows from the word line side to the bit line side. For example, FIG. 13A shows a positive voltage VPP applied to a selected word line (shown schematically as a variable resistance, $R_{WL}$) through WL driver 624 and a negative voltage, VNN, applied to a selected bit line (shown schematically as variable resistance, $R_{BL}$) so that current, Iread, flows from the word line side to the bit line side. In contrast, in a second story (Story1 of FIG. 13B), current flows from the bit line side to the word line side. For example, FIG. 13B shows a positive voltage VPP applied to a selected bit line ($R_{BL}$) through BL driver 614 and a negative voltage, VNN, applied to a selected word line ($R_{WL}$) so that current, Iread, flows from the bit line side to the word line side.

In order to read memory cells of different stories in a multi-story MRAM memory structure (e.g., as illustrated in FIG. 11), read/write circuits may include separate sense amplifiers for reading memory cells in each story. For example, FIGS. 14A-B show an example in which two different sense amplifiers are used for reading nonvolatile memories in different stories.

Figure 14A:
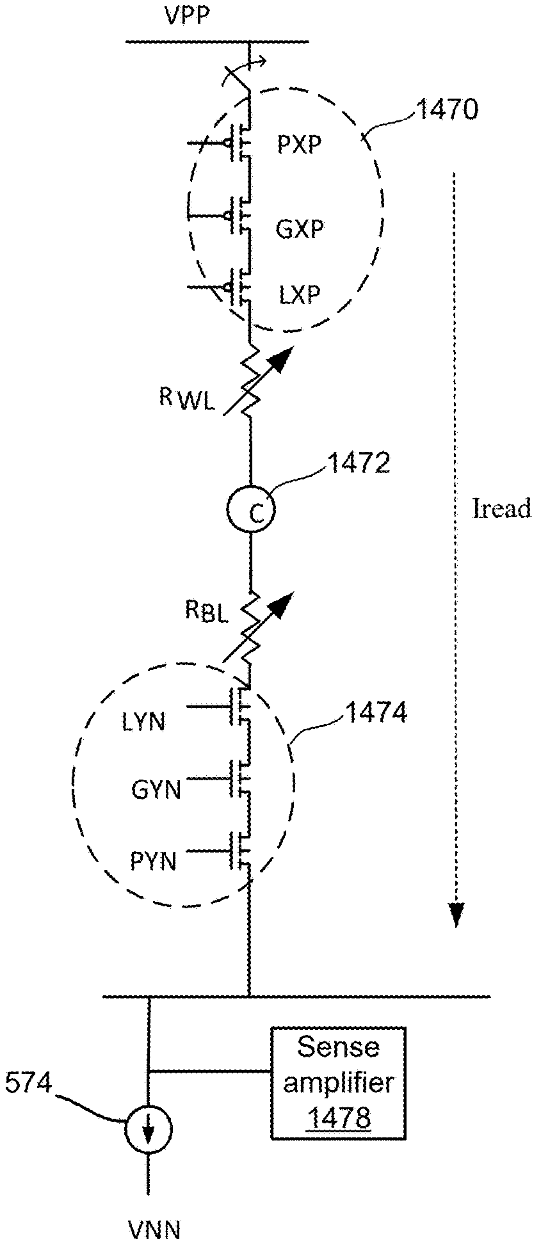
FIGS. 14A-B illustrate an example that includes different sense amplifiers for different stories.

FIG. 14A shows an example of a read operation directed to a nonvolatile memory cell in a first story (Story0 read), for example, Story0 cell of FIG. 11. A positive voltage, VPP, is connected through switches 1470 (e.g., switches of a WL decoder) and a selected word line (e.g., first word line 1100, shown schematically as variable resistance $R_{WL}$) to selected nonvolatile memory cell 1472. A selected bit line (e.g., bit line 1110, shown schematically as $R_{BL}$) connects selected nonvolatile memory cell 1472 through switches 1474 (e.g., switches of a BL decoder) to current mirror 574, which is connected to a negative voltage, VNN, and is configured to maintain a read current, Iread, during a read operation. A low voltage sense amplifier 1478 is connected to sense voltage between the selected bit line and current mirror 574 (e.g., low voltage sense amplifier 1478 may be configured to sense low voltages, including negative voltages, for example, in the range of −2.5 volts to −3.0 volts).

Figure 14B:
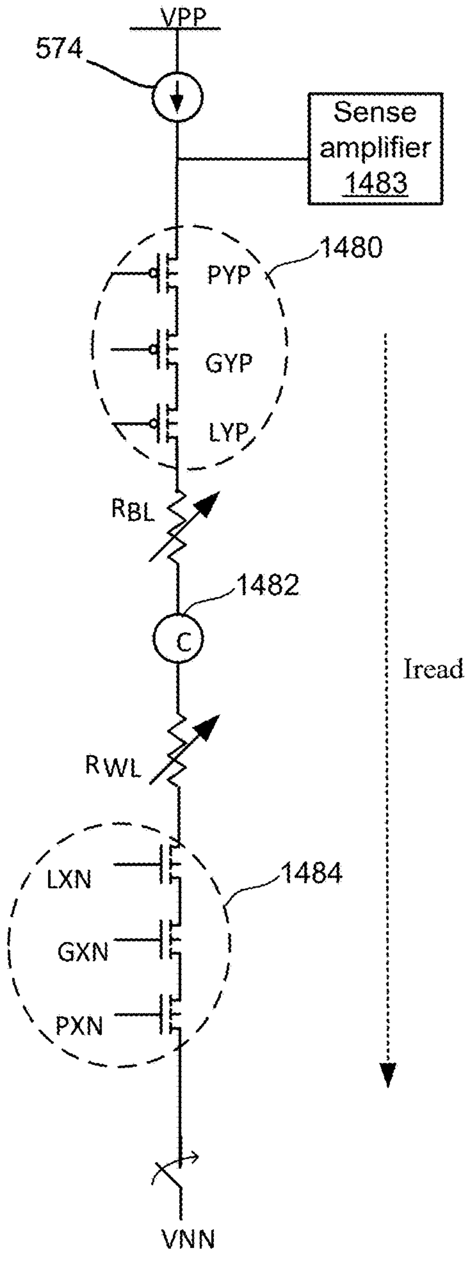

FIG. 14B shows an example of a read operation directed to a nonvolatile memory cell in a second story (Story1 read), for example Story1 cell of FIG. 11. A positive voltage, VPP, is connected through switches 1480 and selected bit line (e.g., bit line 1110, shown schematically as $R_{BL}$) to selected nonvolatile memory cell 1482. A selected word line (e.g., word line 1120, shown schematically as $R_{WL}$) connects selected nonvolatile memory cell 1482 through switches 1484 to a negative voltage, VNN. A high voltage sense amplifier 1483 is connected to sense voltage between the selected bit line and current mirror 574 (e.g., high voltage sense amplifier 1483 may be configured to sense high voltages, including positive voltages, for example in the range of 2.5 volts to 3.0 volts).

Aspects of the present technology include using a single sense amplifier to perform sensing during read operations directed to memory cells of two different stories (e.g., as illustrated in FIG. 11) where current flow is different for reading memory cells of different stories (e.g., word line to bit line in a first story, story0, and bit line to word line in a second story, story1).

Figure 15A:
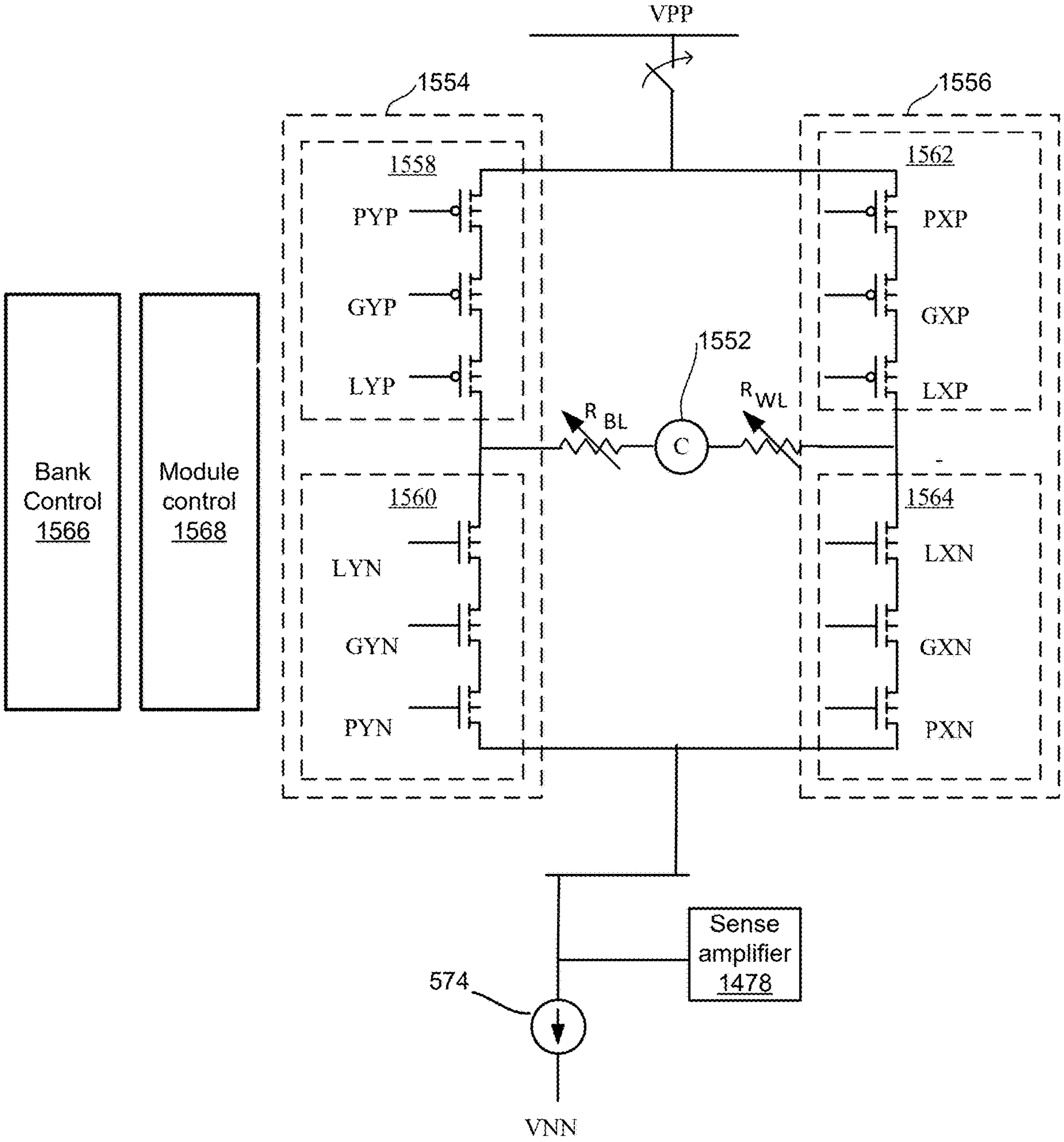
FIGS. 15A-C illustrate aspects of the present technology including a sense amplifier and control circuits configured to enable the sense amplifier to read nonvolatile memory cells in different stories.

FIG. 15A shows an example of control circuits connected to a nonvolatile memory cell 1552 (e.g., a nonvolatile memory cell in any story in an MRAM memory structure, for example, as illustrated in FIG. 11. Nonvolatile memory cell 1552 is connected to a bit line ($R_{BL}$) and a word line ($R_{WL}$), which are connected respectively to bit line switches 1554 and word line switches 1556. Bit line switches 1554 includes a first set of switches 1558 connected between a first voltage, VPP (e.g., a positive voltage), and the bit line and a second set of switches 1560 connected between the bit line and sense amplifier 1478. Word line switches 1556 include a third set of switches 1562 connected between the first voltage, VPP, and the word line and a fourth set of switches 1564 connected between the word line and sense amplifier 1478. Individual switches may correspond to different scales of switching and type of transistor. For example, the first letter indicated next to each transistor/switch may indicate scale (e.g., L=Local, G=Global and P=Plane). The second letter indicates whether it is connected to lines that extend in the x or y direction (e.g., Y for bit lines and X for word lines). The third letter indicates the type of transistor (e.g., P for PMOS and N for NMOS so that first and third switches 1558 and 1562 are formed by PMOS transistors and second and fourth switches 1560 and 1564 are formed by NMOS transistors). FIG. 15A also shows bank control circuit 1566 and module control circuit 1568, which may control signals used to turn on/off bit line switches 1554 and word line switches 1556. For example, control gates of transistors of the first, second, third and fourth sets of transistors may be connected to module control circuit 1568 and/or bank control circuit 1566 (control lines are omitted for clarity). Sense amplifier 1478 is connected above current mirror 574, which is connected to a second voltage, VNN (e.g., a negative voltage).

Figure 15B:
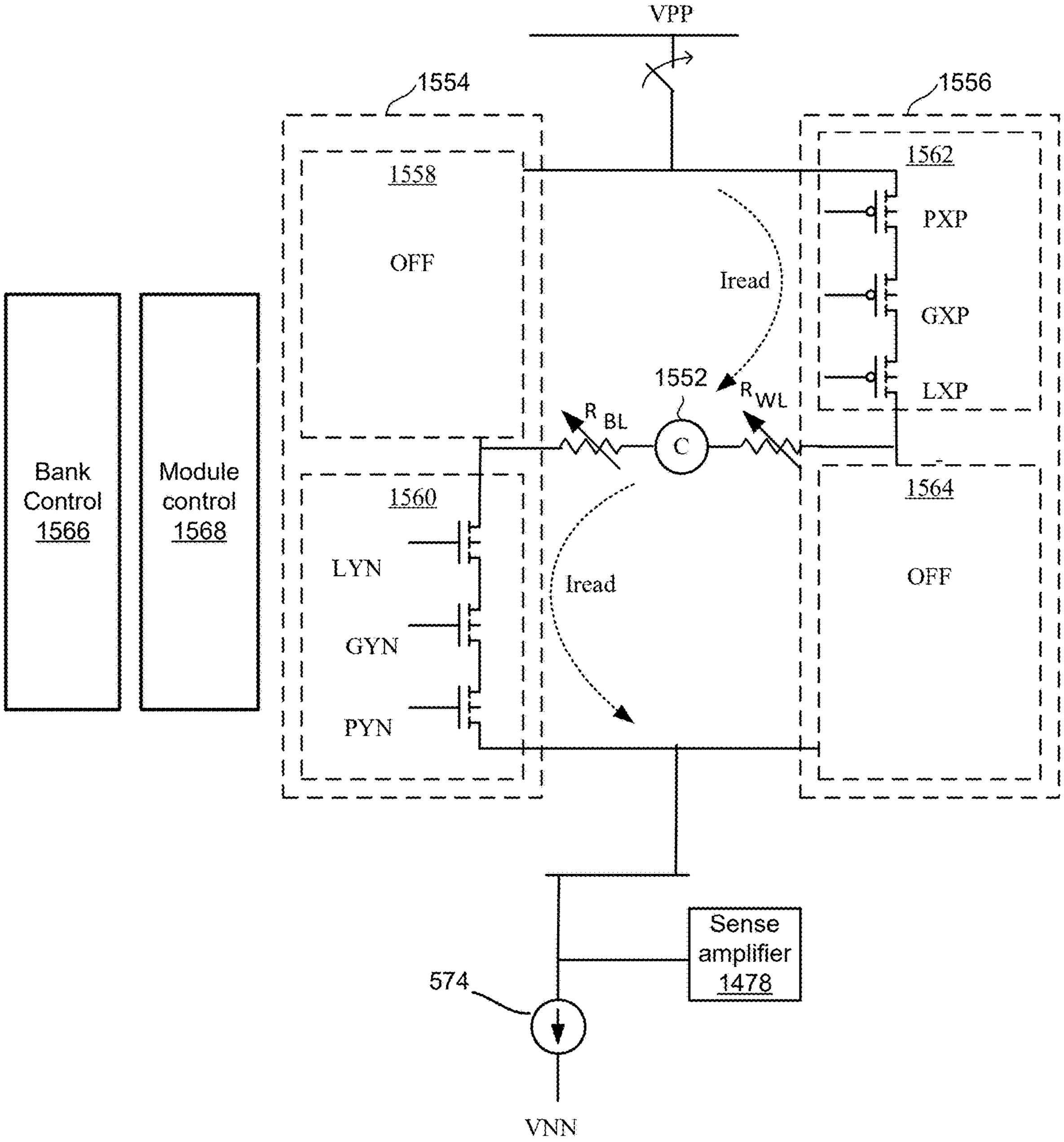

FIG. 15B shows an example of a read operation directed to a first nonvolatile memory cell 1552 in a first story (e.g., Story0 cell in FIG. 11). In this example, first voltage VPP (e.g., positive voltage) is connected through the selected word line to first nonvolatile memory cell 1552 by turning on third switches 1562. Sense amplifier 1478 and first voltage VNN (e.g., negative voltage) are connected to first nonvolatile memory cell 1552 through the bit line by turning on second switches 1560. First switches 1558 and fourth switches 1564 are turned off for this read operation. In this configuration, read current, Iread, flows through switches 1562, the selected bit line, first nonvolatile memory cell 1552, the selected bit line, switches 1560 and current mirror 574 as illustrated by dotted arrows. Sense amplifier 1478 senses voltage above current mirror 574 to determine the state of first nonvolatile memory cell 1552.

Figure 15C:
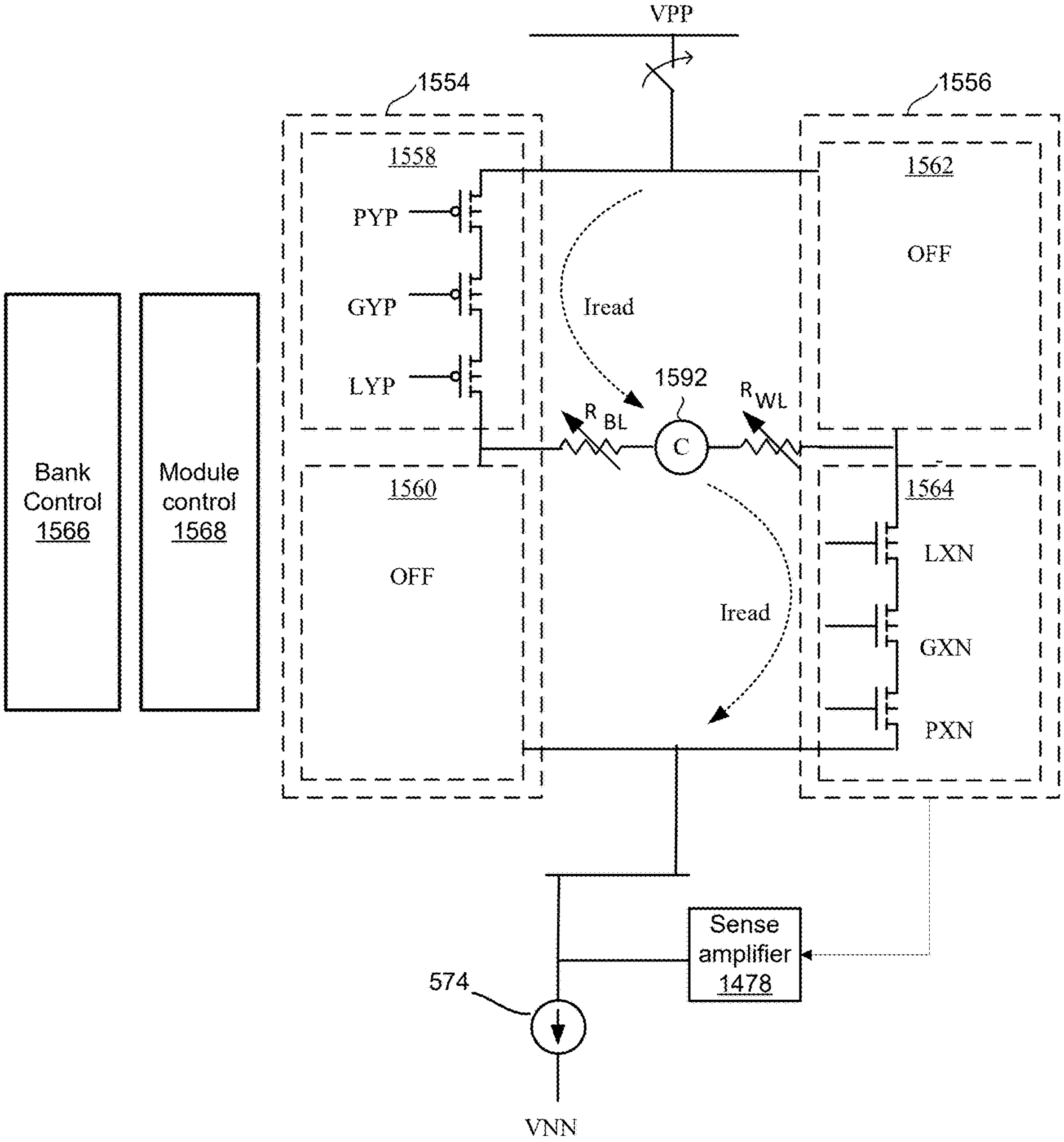

FIG. 15C shows an example of a read operation directed to a second nonvolatile memory cell 1592 in a second story (e.g., Story1 cell in FIG. 11). In this example, first voltage VPP (e.g., positive voltage) is connected through the selected bit line to second nonvolatile memory cell 1592 by turning on first switches 1558. Sense amplifier 1478 and first voltage VNN (e.g., negative voltage) are connected to second nonvolatile memory cell 1592 through the word line by turning on fourth switches 1564. Switches 1560 and switches 1562 are turned off for this read operation. In this configuration, read current, Iread, flows through switches 1558, the selected bit line, second nonvolatile memory cell 1592, the selected word line, switches 1564 and current mirror 574 as illustrated by dotted arrows. Sense amplifier 1478 senses voltage above current mirror 574 to determine the state of second nonvolatile memory cell 1592.

Bank control circuit 1566 and/or module control circuit 1568 (e.g., in combination with other control circuits such as system control logic 560/660) may control first, second, third and fourth switches 1558, 1560, 1562 and 1564 to configure connections as shown in FIG. 15B when reading memory cells in a first story (e.g., Story0) and as shown in FIG. 15C when reading memory cells in a second story (e.g., Story1). For example, control circuits (e.g., bank control circuit 1566, module control circuit 1568 and/or system control logic 560/660) may receive addresses of selected nonvolatile memory cells and for each selected nonvolatile memory cell determine a story in which the selected nonvolatile memory cell is located from a plurality of stories including a first story between a first word line layer and a bit line layer (e.g., Story0 between Word line 1 1100 and Bit line 1110 in FIG. 11) and a second story between the bit line layer and a second word line layer (e.g., Story1 between Bit Line 1110 and Word Line 2 1120). The control circuits may then apply suitable voltages to first, second, third and fourth switches to perform configuration according to the stories in which nonvolatile memory cells are located. Bank control circuits 1566, module control circuits 1568, bit line switches 1554 and word line switches 1556 (alone or in combination with additional switches such as system control logic 560/660) may be considered examples of means for reading nonvolatile memory cells that are located in a plurality of stories including a first story between a first word line layer and a bit line layer (e.g., Story0 of FIG. 11) and a second story between the bit line layer and a second word line layer (e.g., Story1 of FIG. 11) including connecting a sense amplifier to a first selected nonvolatile memory cell in the first story through a bit line of the bit line layer (e.g., see FIG. 15B) and connecting the sense amplifier to a second selected nonvolatile memory cell in the second story through a second word line of the second word line layer (e.g., see FIG. 15C). While the examples of FIGS. 15B-C refer to read operations, any memory access operation (e.g., write operations) may be similarly applied to memory cells in different stories using aspects of the present technology.

Figure 16:
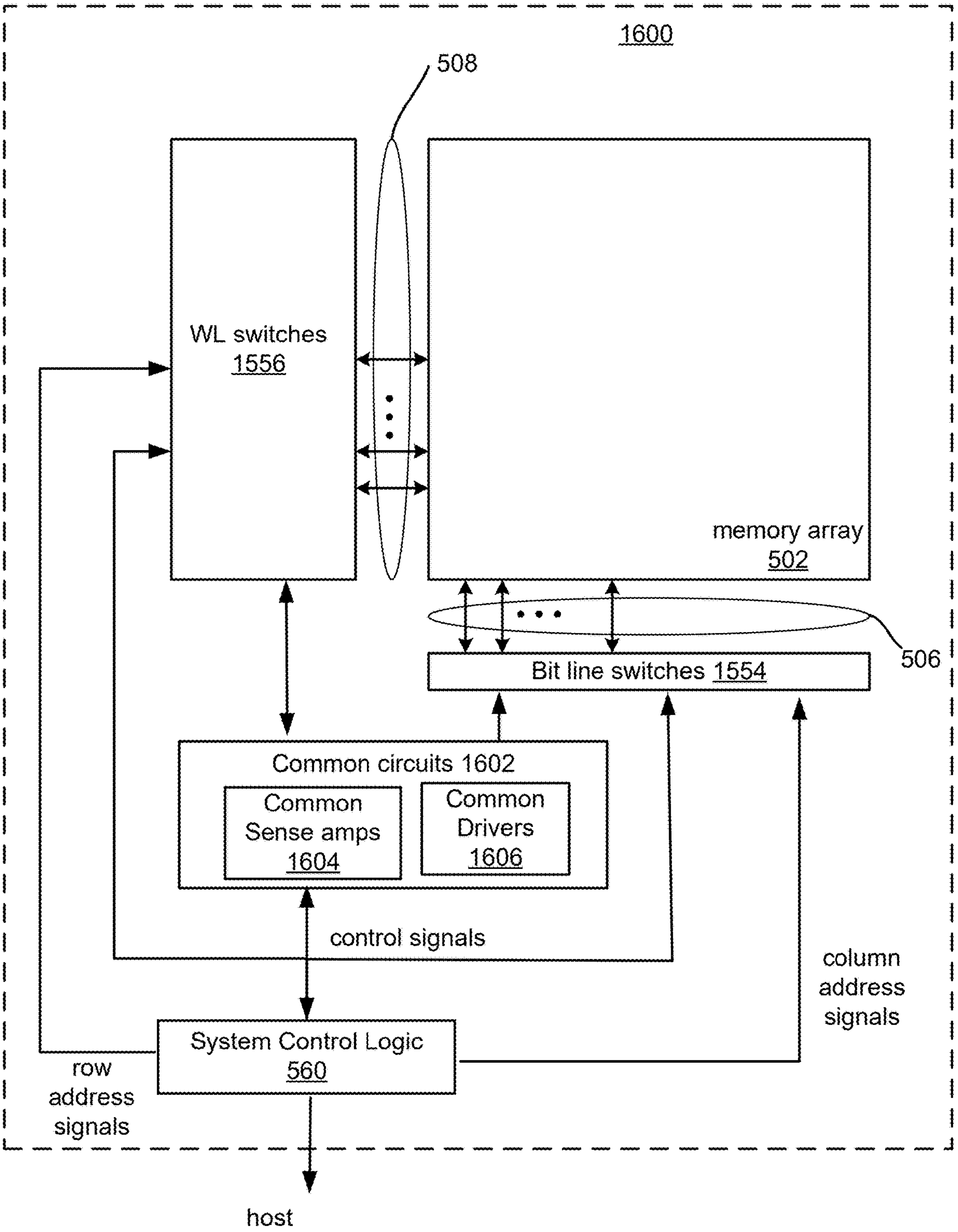
FIG. 16 illustrates an example of a memory die that includes common sense amplifiers.

FIG. 16 shows a simplified schematic of a memory die 1600 that implements aspects of the present technology. For example, FIG. 16 shows bit line switches 1554 connected to bit lines of memory array 502 through input/outputs 506 and word line switches 1556 connected to word lines of memory array 502 through input/output lines 508. Bit line switches 1554 and word line switches 1556 are connected to common control circuits 1602, which include common sense amplifiers 1604 and common drivers 1606. For example, each sense amplifier of common sense amplifiers 1604 may be connected to either a bit line (through bit line switches 1554) or a word line (through word line switches 1556) and in this way may be used for sensing nonvolatile memory cells in different stories. Similarly, each driver of common drivers 1606 may be connected to either a bit line (through bit line switches 1554) or a word line (through word line switches 1556) and in this way may be used to drive appropriate voltages (e.g., VPP and VNN) on either a bit line or a word line. In this way, common drivers 1606 may be used for read operations directed to memory cells in different stories.

Other components of memory die 1600 may be similar to components of memory system 500 and are not further described here. An integrated memory assembly may be implemented using WL switches, bit line switches and common circuits that may be connected to either (e.g., integrated memory assembly 600 may be configured to include word line switches 1665, bit line switches 1554 and common control circuits 1602.

Figure 17:
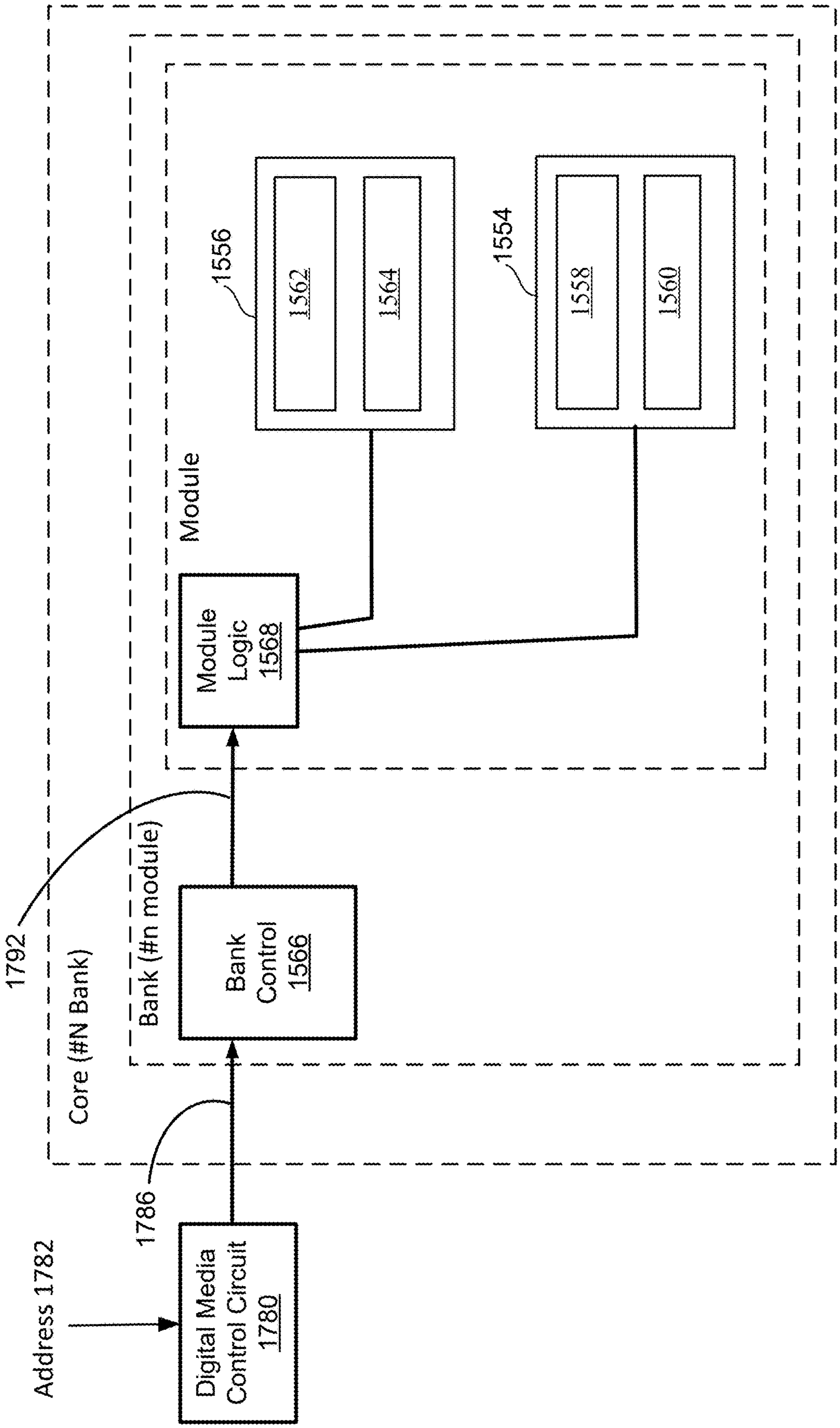
FIG. 17 illustrates a portion of a data storage system according to an example of the present technology.

FIG. 17 shows an example implementation of aspects of the present technology in a data storage system that includes a core formed of N banks, with each bank having n modules. FIG. 17 shows an example of control circuits that may be used to control switches that connect common sense amplifiers and/or drivers to word lines and bit lines.

Digital media control circuit 1780 receives an address 1782 (e.g., a logical address in a read command directed to one or more nonvolatile memory cell). Digital media control circuit 1780 may use address 1782 to generate location information 1786 (e.g., a physical address) in an appropriate format. For example, location information 1786 may include a bank, module, story and coordinates (e.g., bit line and word line) where a selected nonvolatile memory cell to be read is located (e.g., where a memory structure had stories or layers with different characteristics as illustrated in FIG. 11).

Digital media control circuit 1780 sends location information 1786 to Bank Control circuit 1566. Bank Control circuit may use location information 1786 to determine in which story (e.g., first story, Story0, or second story, Story1) a nonvolatile memory cell is located. Bank control circuit 1566 sends signal 1792 to module control circuit 1568. Module control circuit 1568 generates signals to enable/disable switches of bit line switches 1554 (e.g., first set of switches 1558 and second set of switches 1560) and word line switches 1556 (e.g., third set of switches 1562 and fourth set of switches 1564). For example, for read operations directed to nonvolatile memory cells in a first story, module control circuit 1568 may generate signals to configure switches as illustrated in FIG. 15B while for read operations directed to nonvolatile memory cells in a second story, module control circuit 1568 may generate signals to configure switches ad illustrated in FIG. 15C. While FIG. 17 shows a specific arrangement of components, the present technology is not limited to any particular arrangement and may be implemented using a wide range of components.

FIG. 18A illustrates an example of a method that includes receiving a first address of a first selected nonvolatile memory cell at an intersection of a first word line and a first bit line in a nonvolatile memory cell structure 1820 (e.g., lower cell of FIG. 11), determining that the first selected nonvolatile memory cell is in a first story 1822 (e.g., Story0), in response to determining that the first selected nonvolatile memory cell is in the first story, connecting a sense amplifier to the first bit line to read the first selected nonvolatile memory cell 1824 (e.g., as illustrated in FIG. 15B). The method further includes receiving a second address of a second selected nonvolatile memory cell at an intersection of the first bit line and a second word line in the nonvolatile memory cell structure 1826 (e.g., upper cell of FIG. 11), determining that the second selected nonvolatile memory cell is in a second story 1828 (e.g., Story1) and, in response to determining that the second selected nonvolatile memory cell is in the second story, connecting the sense amplifier to the second word line to read the second selected nonvolatile memory cell 1830 (e.g., as illustrated in FIG. 15C).

FIG. 18B shows method steps that may be performed alone or in combination with steps shown in FIG. 18A. The steps include passing a first current through the first word line, the first nonvolatile memory cell, the first bit line and a current mirror to read the first nonvolatile memory cell 1840 (e.g., Iread in FIG. 15B) sensing the first nonvolatile memory cell by the sense amplifier by comparing a sense voltage between the first bit line and the current mirror with a reference voltage while passing the first current 1842, passing the first current through the first bit line, the second nonvolatile memory cell, the second word line and the current mirror to read the second nonvolatile memory cell 1844 (e.g., Iread in FIG. 15C) and sensing the second nonvolatile memory cell by the sense amplifier, including comparing a sense voltage between the second word line and the current mirror with the reference voltage while passing the first current 1846.

The memory device embodiments presented above use a cross-point architecture where each MRAM cell is built at the cross-sectional area between a vertical bit line (on one level) and a horizontal word line (built above or below). For die-size savings, embodiments can use an architecture that allows the CMOS select transistors to be placed below the memory array. Accessing a given memory cell requires charging one of several (ex: 256, 512, 1024, or 2048) bit lines and word lines through the collection of select transistors in the decoder (multiplexer) circuits, such as in the row control circuitry 520/620 and column control circuitry 510/610 of FIG. 3 or FIG. 4. As discussed above, the MRAM cross-point array embodiments use both positive and negative bias levels. The following discussion presents embodiments of such bipolar decoder circuitry. The example embodiments used this discussion will be for cross-point MRAM memory where the decoder circuitry is located on the same die as the memory cells and under the memory cells, but can applied more generally to other embodiments such as those based on other programable resistance elements such as ReRAM, FeRAM, RRAM, or PCM memory cells and embodiments where the decoder circuitry in formed on the periphery of the memory arrays or on a separate control die as in the embodiment of FIG. 4.

Turing now to a discussion of the decoder circuitry and its requirements, a decoder is a multiplexing circuit that provides a unique connection (and current delivery capability) to each of the lines that it drives. In an example embodiment, bit line decoders drive one of 1024 bit lines and word line decoders drive one of 1024 word lines. In a cross-point structure, the decoders can be identical in both cases. In the inactive state, deselect transistors drive the bit lines and word lines to ground (0V). To program an MRAM cell (i.e., to change its state from logical 1 to logical 0, or vice versa) current must flow from the bit line to the word line or from the word line to the bit line in the opposite case. Consequently, decoders must be capable of sourcing current (when driving a line positive) and sinking current (when pulling the line negative). The cell is bipolar. Therefore, the decoders must be bipolar.

Figure 19A:
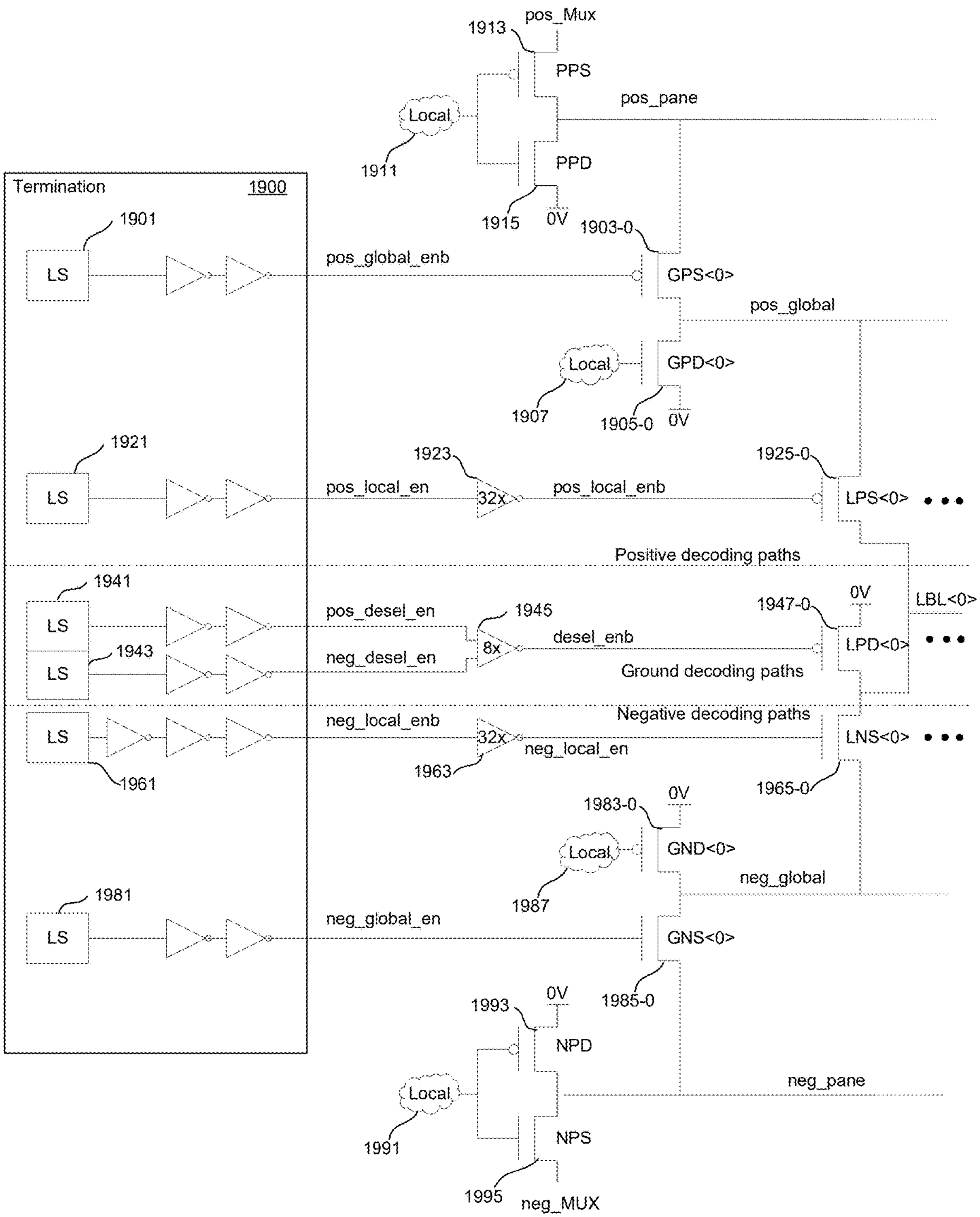
FIGS. 19A and 19B present an embodiment for a bipolar decoder, where the two figures show different parts of the circuitry and together make up the embodiment for the circuit.
Figure 19B:
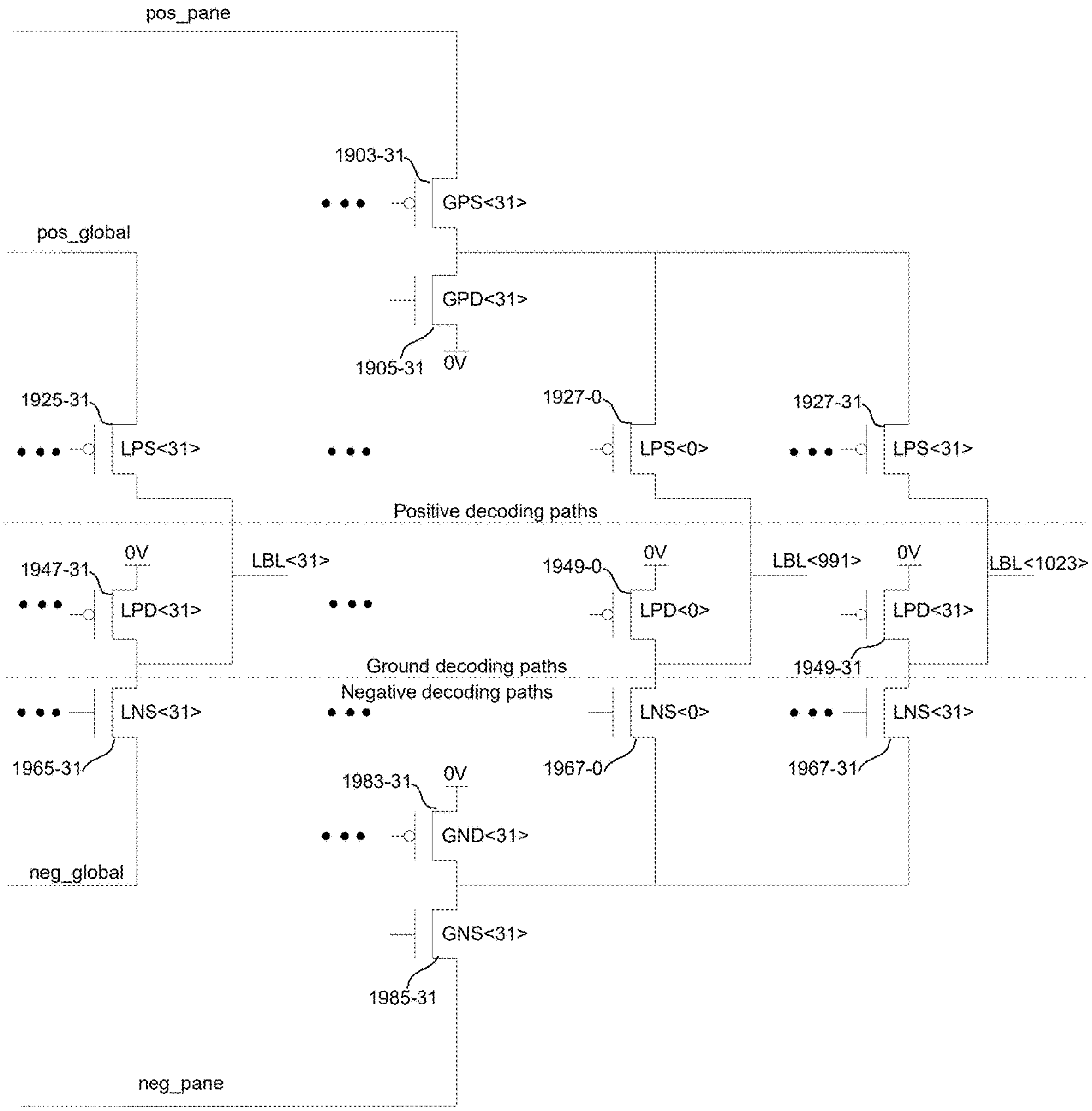

FIGS. 19A and 19B present an embodiment for a bipolar decoder, where the two figures show different parts of the circuitry and together make up the embodiment for the circuit. The decoder includes positive decoding paths (above the upper broken horizontal line), ground decoding paths (between the broken horizontal lines), and negative decoding paths (below the lower broken line). FIGS. 19A and 19B are for a bit line decoder, but the word line decoders can be similarly arranged. In the shown example embodiment, a hierarchical decoding is used, initially at the "pane" (i.e., a cross-point array section) level, then at the global level, and finally the local level. Considering the pane select, a local control signal 1911 is connected to the positive pane select PMOS switch PPS 1913 and the positive pane deselect NMOS switch PPD 1915 to supply the bias level pos_MUX to the pos_pane supply line when the pane is selected (the local value is low), which feeds into (in this example) 32 global selects. The positive bias level pos_MUX will depend on the operation being performed. The global positive select switches GPS<0> 1903-0 to GPS<31> 1903-31 are connected to pos_pane and receive their enable signal pos_global_enb (where "b" stands for bar, or inverse, as the 1903 are PMOS) through a set of inverter/drivers from a level shifter 1901 from the termination circuit 1900 to feed the corresponding pos_global signals to (again, in this example) 32 local select switches. The pos_global lines are connected to ground through the global positive deselect switches GPD<0> 1905-0 to GPS<31> 1905-31 and receive a local control signal 1907.

Each positive global supply line pos_global for each global select/deselect switch GPS 1903/GPD 1905 is connected to a corresponding set of bit lines through a local positive select switch. For example, as shown in FIGS. 19A and 19B the pos_global line from GPS<0> 1903-0 is connected to local bit lines LBL<0> to LBL<31> through respective local positive select switches LPS<0> 1925-0 to LPS<31> 1925-31 and the pos_global line from GPS<31> 1903-31 is connected to local bit lines LBL<991> to LBL<1023> through respective local positive select switches LPS<0> 1927-0 to LPS<31> 1927-31, with the other, un-shown bit lines similarly connected. The control signals for the local positive select switches (pos_local_enable) are again provided from a level shifter 1921 in the termination circuit 1900 through a set of drivers in the termination circuit 1900. An additional driver/inverter 1923 for each of the 32 local positive control signals for the local positive select switches, pos_local_enb, to drive PMOS select gates, where, as discussed further below, the additional drivers/inverters 1923 are located near to the actual switches. The positive and negative local deslect signals are part of the ground decoding paths for the termination circuitry 1900. For the positive decoding side, level shifter 1941 provides the positive deselect enable signal (pos_desel_en) through a set of drivers/inverters to the local positive deselect switches of PMOSs LPD<0> 1947-0 to LPD<31> 1947-31 for the bit lines supplied by GPS<0> 1903-0 and of PMOSs LPD<0> 1949-0 to LPD<31> 1949-31 for the bit lines supplied by GPS<31> 1903-31. An additional set of drivers/inverters 1945 is again placed on the periphery of the array to generate the inverse desel_enb from pos_desel_en and also from the negative deselect enable signals neg_desel_en from level shifter 1943, as when a bit line is deselected, for whether a positive or negative is used for selected bit lines, the deselected bit lines are set to ground. Consequently, in this example embodiment, there is one pane select (PPS) which feed into 32 global selects (GPS). Each global select feed into 32 local selects (LPS), which results in 1024 unique bit lines connections. In the off/idle state the deselects (PPD, GPD, LPD) drive ground onto each level in the decode path.

Considering the rest of the negative portion of the of the decoder, the negative decoding paths mirror the positive decoding paths and are laid out similarly, but the selection is now between ground and the negative voltage neg_MUX for the selected operation, with the negative voltages selected through NMOS devices and the deselect connections to ground made through PMOS devices. More specifically, the pane level selection connects the line neg_pane to either ground through NPD 1993 or neg_MUX by NPS 1995 based on the local control signals 1991. Global decoding to provide the neg_global signals, when selected, is then performed by NMOS switches GNS<0> 1985-0 to GNS<31> 1985-31 based on the control signals neg_global_en from the level shifters 1981 and, when deselected, is performed by PMOS switches GND<0> 1983-0 to GND<31> 1983-31 based on the local control signals 1987. For the local decoding for the local bits lines, deselection is as described above for the positive decoding side. For decoding selected local bits lines, control signals neg_local_enb is provided by level shifter 1961 through a set of drivers/inverts, where the extra relative driver/inverter is included as the switches are now NMOS. The neg_local_en signals are then again generated by the drivers/inverters 1963 placer nearer the decoding switches. The negative local enable signals are then supplied to the control gates of switches LNS<0> 1965-0 to LNS<31> 1965-31 for the local switches fed by GNS<0> 1985-0, to the control gates of switches LNS<0> 1967-0 to LNS<31> 1967-31 for the local switches fed by GNS<0> 1985-31, and similarly for the other switches not shown.

Figure 20:
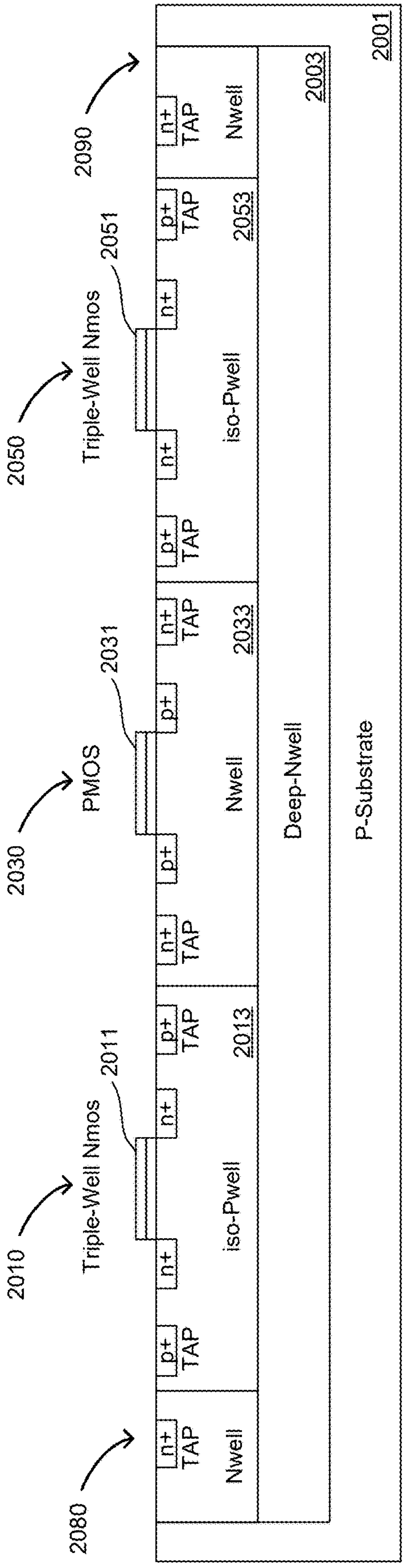
FIG. 20 illustrates an embodiment of a triple well transistor, such as can be used for the decoder switches of FIGS. 19A and 19B.

FIG. 20 illustrates an embodiment of a triple well transistor, such as can be used for the decoder switches of FIGS. 19A and 19B. Because the negative decoding paths side passes negative voltages (e.g., −2.5V), triple well transistors are used. In FIG. 20, a PMOS 2030 is sited between a pair of triple-well NMOSs 2010 and 2050 over Deep-Nwell 2003 within a P-substrate 2001. The PMOS switch 2030 includes a control gate 2031 with a p+ region to either side over the Nwell 2033, with n+ taps to either side of the p+ regions. The Nwell 2033 for the PMOS 2030 and Deep-Nwell 2003 for the triple well NMOS are shorted. The triple-well NMOSs 2010/2050 have respective control gates 2011/2051 over isolation Pwell regions 2013/2053. To either side of the NMOS control gates is an n+ region and, to either side of those, a p+ tap. Within the P-substrate 2001 and over the deep-Nwell 2003 on the outside of triple-well NMOS 2010 and triple-well NMOS 2080 are respective Nwells 2080 and 2090 with respective n+ taps. This arrangement can be used for both of the bit line decoding circuitry of FIGS. 19A and 19B, as well as for the word line select circuitry that can have a similar structure.

Figure 21:
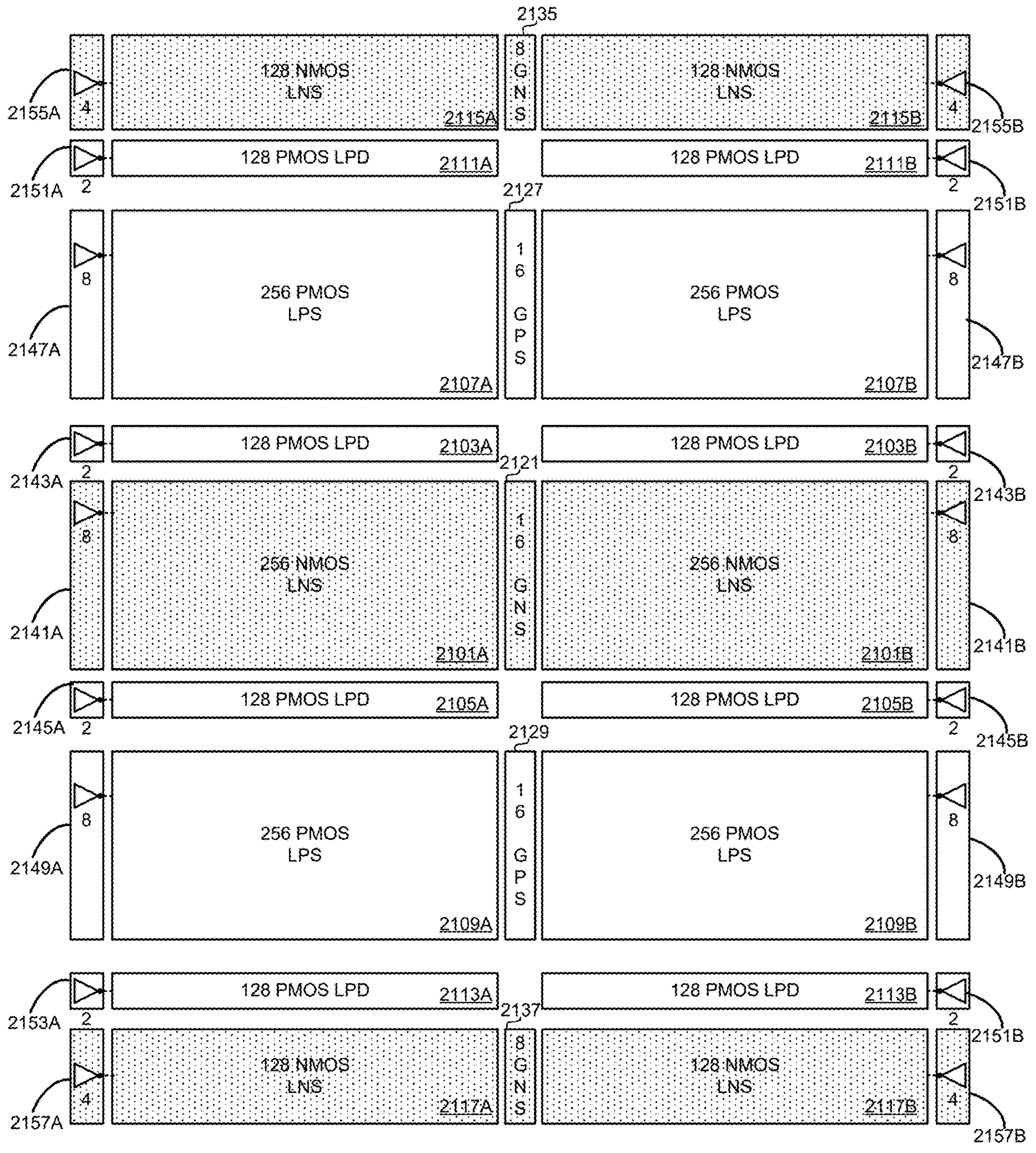
FIG. 21 is an embodiment for a floorplan of the decoder of FIGS. 19A and 19B.

FIG. 21 is an embodiment for a floorplan of the decoder of FIGS. 19A and 19B. This example illustrates the bit line decoder, but, as explained below with respect to FIG. 23, a similar arrangement can be used for the word line decoder or decoder layers. In this example, the decoder drives 1024 lines, with 512 lines driven from the left and the other 512 driven from the right. Instead of grouping all of the NMOS and PMOS devices together, as illustrated in FIG. 20, the different device types have been separated to accommodate the exemplary embodiment of the array via hook-up strategy.

More specifically, as arranged in the figures, the global select decoders are located at center, with half of the local select decoders to either side. Each of these sets of decoders is then split into NMOS, negative select regions (the stippled regions) and PMOS, positive select regions. In this example, half of the NMOS local negative select (LNS) switches are at center, and again split in half into a left portion 2101A of 256 switches and a right portion 2101B of 256 switches, with the corresponding set of 16 global negative select (GNS) 2121 located between the two sides. To either side of the LNS arrays 2101A and 2101B on the edge of the switch arrays corresponding local drivers/inverters 2141A and 2141B corresponding to 8 of the element 1923 of FIG. 19A, allowing for well-defined control signal levels.

Half of the PMOS local positive select (LPS) switches are above the central LNS regions and half are below, and are again split in half into a left portions 2107A of 256 switches and a right portion 2107B of 256 switches above and a left portions 2109A of 256 switches and a right portion 2109B of 256 switches below. The corresponding sets of 16 global positive select (GPS) 2127 and 2129 located between the two sides. To either side of the LPS arrays 2107A/2107B and 2109A/2109B on the edge of the switch arrays are corresponding local drivers/inverters 2147A/2147B and 2149A/2149B corresponding to 8 of the element 1963 of FIG. 19A.

The remaining half to the NMOS LNS switches are again split into halves, and again into left and right halves, with 128 NMOS LNS switches 2115A/2115B at top, with corresponding GNS switches 2135 located between and corresponding edge drivers/inverters 2155A/2155B to either side; and 128 NMOS LNS switches 2117A/2117B at top, with corresponding GNS switches 2137 located between and corresponding edge drivers/inverters 2157A/2157B to either side. The PMOS local positive deselect (LPD) are then split into four groups, and further into left and portions, and located between the LNS and LPS blocks, again corresponding edge located drivers to either side: 2103A/B and 2143A/B above the central LNS blocks; 2105A/B and 2145A/B below the central LNS blocks; 2111A/B and 2151A/B above the upper LPS blocks; and 2113A/B and 2153A/B below the lower LPS blocks. FIG. 21 and the following related figures are one example, but other embodiments can switch the placement of the NMOS LNS blocks and PMOS LPS blocks (along with the corresponding GNS/GPS and driver blocks), also number of drivers in each block, where is a tradeoff between block layout size and routing optimization.

Figure 22:
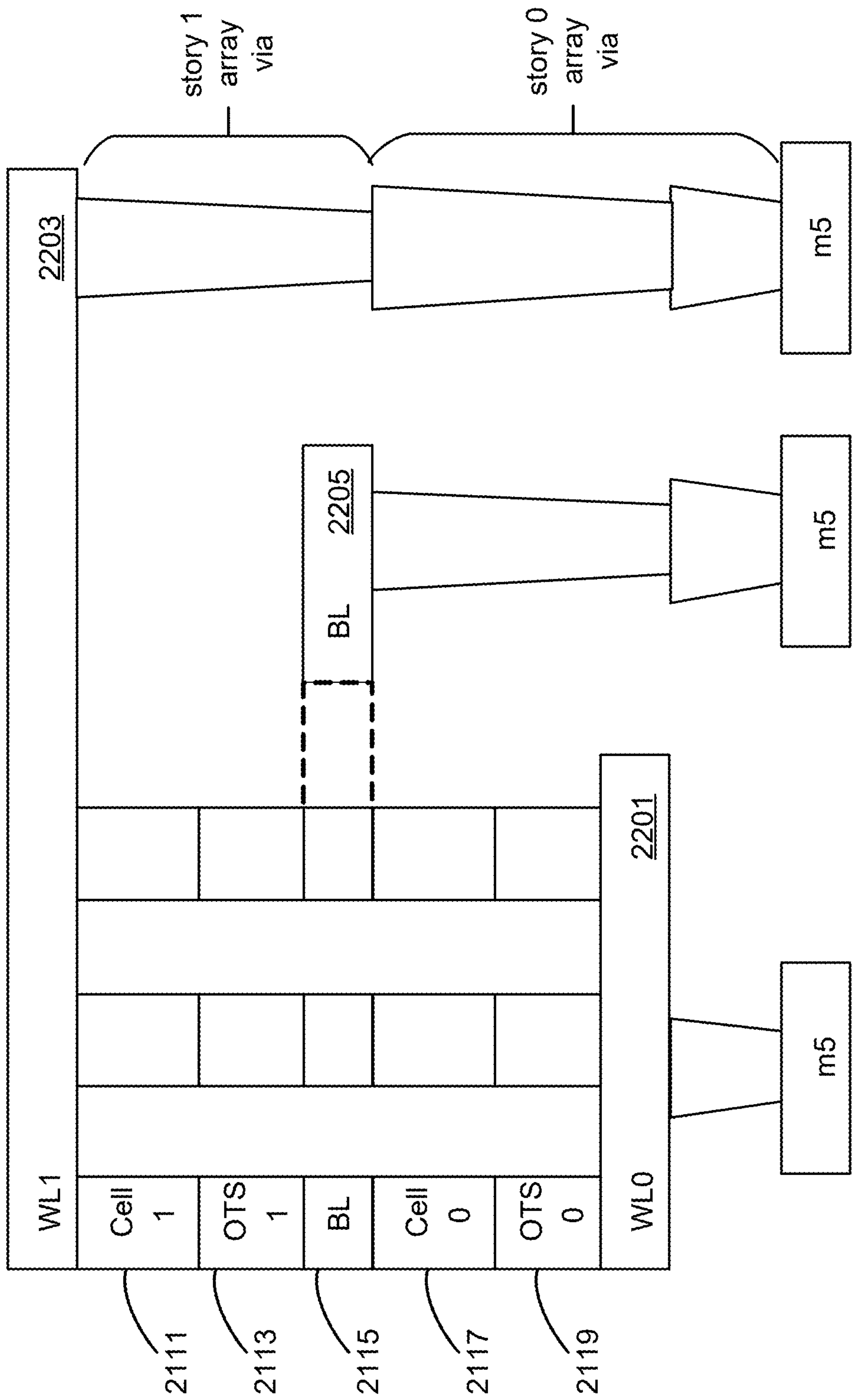
FIGS. 22 and 23 illustrate an embodiment for the hook-ups of the location of the array vias connecting the decoder circuits the word lines and bit lines of the associated cross-point array
Figure 23:
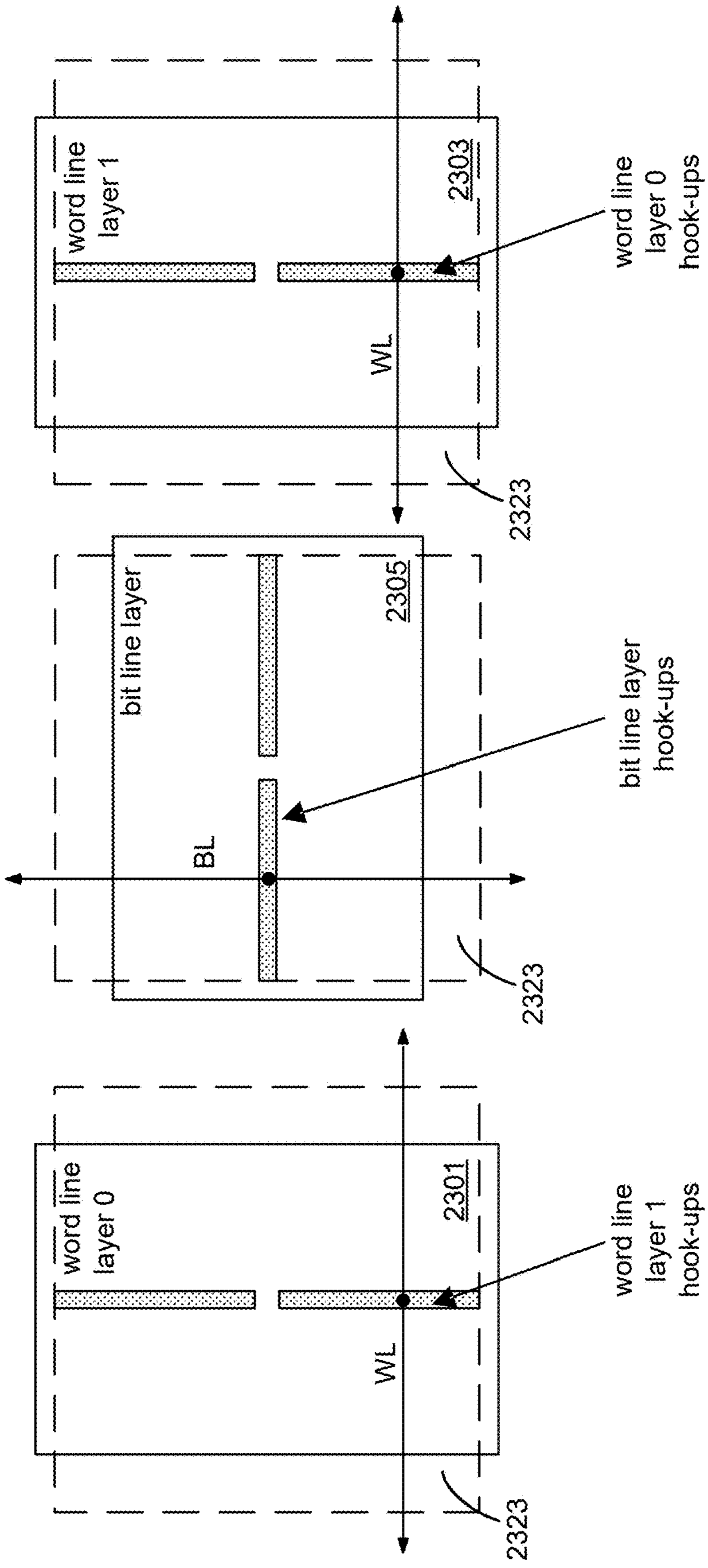

FIGS. 22 and 23 illustrate an embodiment for the hook-ups of the location of the array vias connecting the decoder circuits the word lines and bit lines of the associated cross-point array (or pane). FIGS. 22 and 23 are for a two story cross-point array, as in the embodiment of FIG. 7D. In FIG. 22, word line layer WL1 2203 is over a bit line layer 2205, which is in turn over the story 0 word line layer 2201. FIG. 22 is oriented such that the bit lines of layer 2205 run into the page and the word lines of layer 2201 and 2203 run left to right. Three memory cells are shown in each story, with the left-most one labelled as memory cell 1 2111 and selector OTS 1 in story 1 and memory cell 0 2117 and selector OTS0 in story 0. The bit lines of layer BL 2205 and word lines of layer WL0 2201 and WL1 2203 will each need to be connecter a corresponding set of decoders, such as the decoder of FIGS. 19A, 19B, and 20 for the bit lines and a similar set of decoders for each of the word line layers. Due to the different orientation of bit lines and word lines, the corresponding decoders will also need to be differently oriented. A corresponding set of vias connect the bit line and word line layers to a set of metal layer contacts m5 that are connected to the decoder circuits as shown in FIG. 24 to provide the bias levels for the word lines and bit lines.

FIG. 23 illustrates an embodiment for the orientation of the three decoders for word line layer 0 2301, bit line layer 2305, and word line layer 1 2303. FIG. 23 shows these decoders side by side, but in the example embodiments they are placed one above another. For example, in one set of embodiments, the decoders are below the array, represented by the broken block 2323, and the vias of FIG. 22 would connect the underlying decoders. In an embodiment such as FIG. 4, the decoder layers would be on the control die 611, which would then connect at the m5 contacts. The decoder layers 2301, 2305, and 2303 can be stacked in the same order as the word line and bit line layers, with the bit line layer 2303 in the middle, or otherwise, depending on the embodiment. The orientation of the word lines (WL) in the word line layer 0 decoder 2301 and layer a 2303 decoder run left to right, as in FIG. 22, with the decoders connecting (as represented by the black dot) in the central, stippled region, where the m5 connectors will be located. The orientation of the bit lines (BL) in the bit line layer decoder 2305 run up and down, corresponding to a top view in FIG. 22, with the decoders connecting (as represented by the black dot) in the central, stippled region, where the m5 connectors will be located.

To provide all of the bias conditions for memory operations, each bit line and word line needs to connect a positive local select (LPS), negative local select (LNS) and local deselect (LPD) from the corresponding decoder. Minimum design rules do not allow for a single interconnect layer, so that two layers (metal layers 4 and 5, m4 and m5) are used to connect select transistors to the array vias. To accommodate this, the NMOS and PMOS transistors are separated. FIG. 24 is a side view of these connections.

Figure 24:
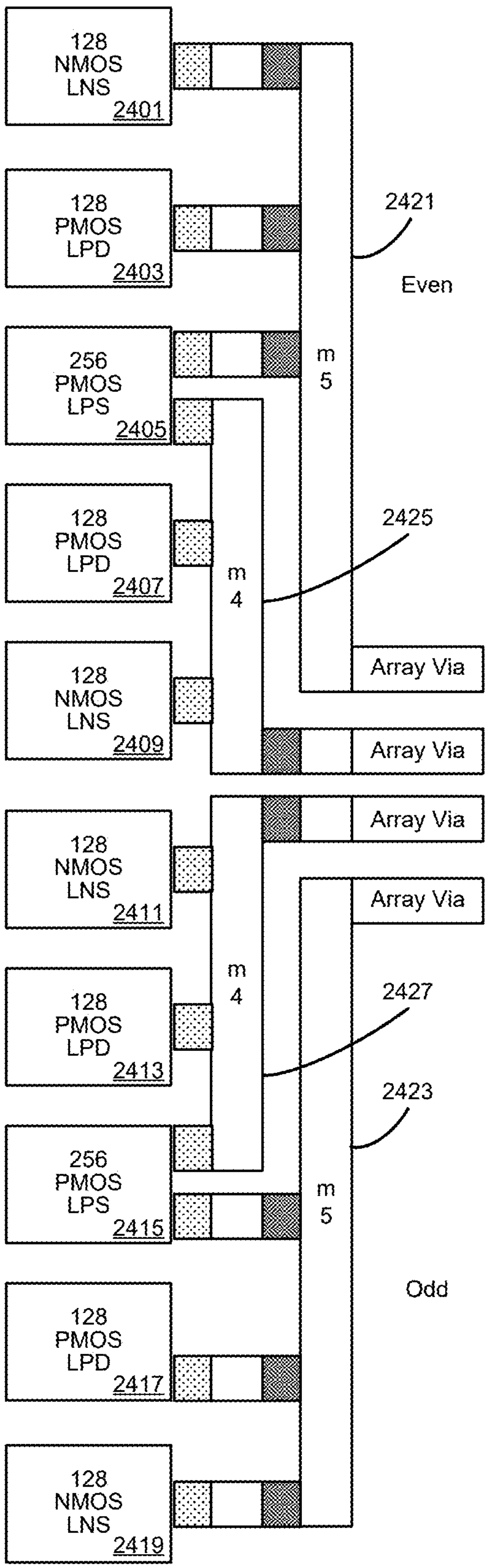
FIG. 24 is a side view of an embodiment of the different decoder blocks of FIG. 21 and how these connect to the metal layers of FIG. 22.

FIG. 24 is a side view of an embodiment of the different decoder blocks of FIG. 21 and how these connect to the m5 metal layer of FIG. 22. Relative to FIG. 21, FIG. 24 is similarly oriented top to bottom, but in a side view. NMOS LNS block 2401 can correspond to blocks 2115A and 2115B of FIG. 21; PMOS LPD block 2403 can correspond to blocks 2111A and 2111B; PMOS LPS block 2405 can correspond to blocks 2107A and 2107B; and PMOS LPD block 2407 can correspond to blocks 2103A and 2103B. NMOS LNS blocks 2409 and 2411 together can correspond to 2101A and 2101B, where, as illustrated below with respect to FIG. 25, the NMOS LNS select blocks 2101A and 2101B lie below the hook-up region and their routing runs in different directions. Similarly, PMOS LPD block 2413 can correspond to blocks 2105A and 2105B; PMOS LPS block 2415 can correspond to blocks 2109A and 2109B; PMOS LPD block 2417 can correspond to blocks 2113A and 2113B; and NMOS LNS block 2419 can correspond to blocks 2117A and 2117B.

The upper half of the blocks in FIG. 24 can correspond to even bit lines and the lower half of the blocks can correspond to odd bit lines. Each of the decoder blocks are routed to the m4 metal layer through the connections with the lighter stippling, and then through the connection with the heavier stippling to the m5 metal layer, which then connects to the array vias as illustrated in FIGS. 22 and 23. (Concerning the naming m4 and m5, in one set of embodiments the lower number metal layers are used to form the decoders, with the routing layers here labelled m4 and m5.) For routing, the decoder blocks are grouped at the different layers, with blocks 2401, 2403, and half of 2405 grouped in the section 2421 of the m5 layer and then to the upper set of the array vias; the other half of 2405, 2407, and 2409 grouped in the section 2425 of the m4 layer and then to the second set of array vias; 2411, 2413, and half of 2415 are grouped in the section 2417 of the m4 layer and then to the third set of array vias; and the other half of 2415, 2417, and 2419 are grouped in section 2423 of the m5 layer and then on to the lower set of array vias. A top view of this routing is given in FIG. 25.

Figure 25:
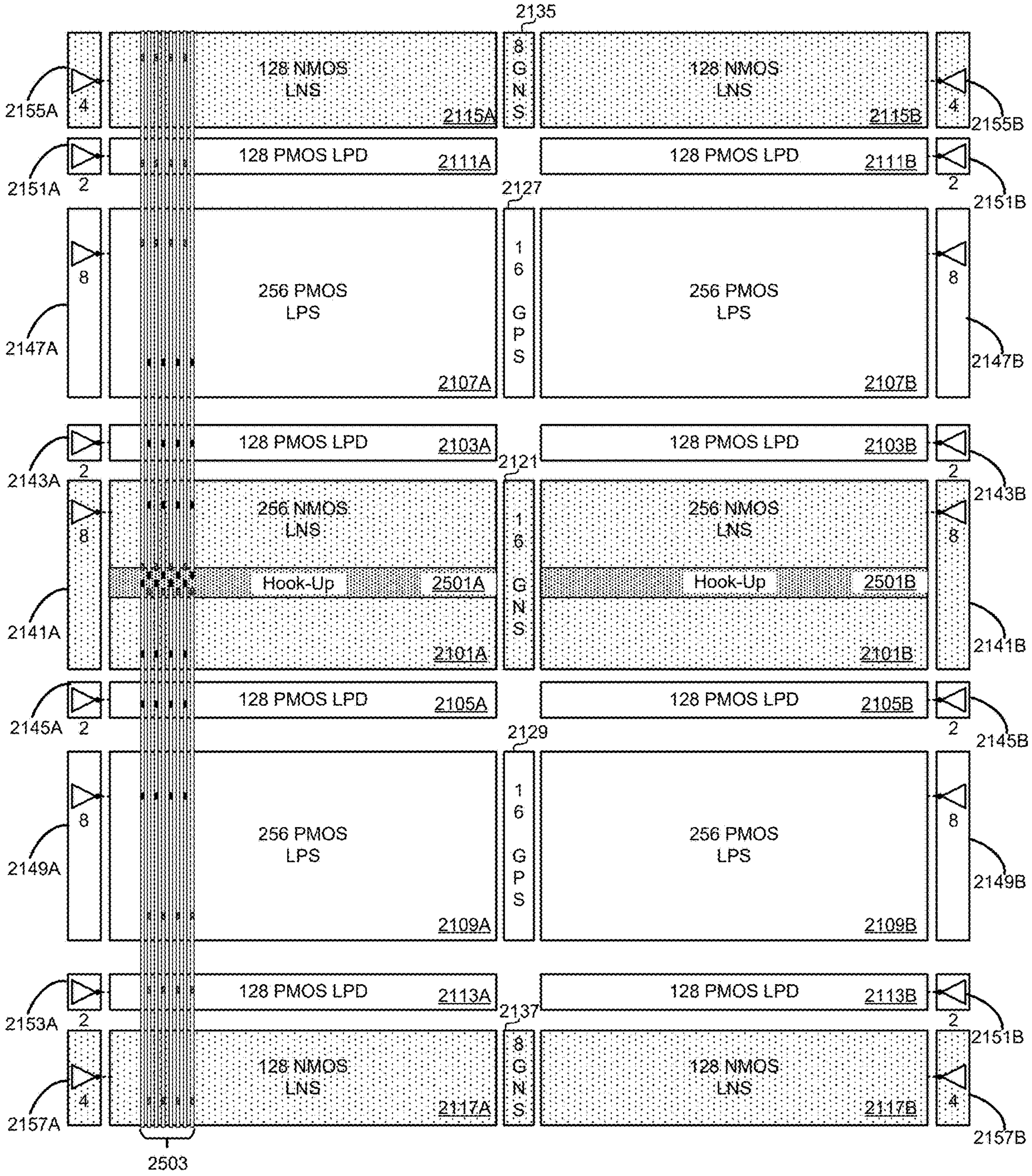
FIG. 25 repeats the decoder of FIG. 21, but with a portion of the routing from FIG. 24 shown in a top view.

FIG. 25 repeats the decoder of FIG. 21, but with a portion of the routing from FIG. 24 shown in a top view added. The hook-up regions 2501A and 2501B correspond the hook up regions of the bit line layer 2305 of FIG. 23. The hook-up regions 2501A and 2501B span the width of the respective NMOS LNS regions 2101A and 2101B, where the is a gap over the GNS region 2121 as these switches supply the local switches, rather than connecting directly to the memory array vias. A section of the m4 and m5 metal layers are shown at 2503, where these would cover the whole of the local select decoding switches, but only a portion is shown at 2503 for clarity. By placing the hook-up regions 2501A and 2501B centrally, the amount of routing can minimized, which can both simplify the structure and also, as the lines are short relative to having the hook-ups on the edges, reduces RC delays along the lines.

Figure 26:
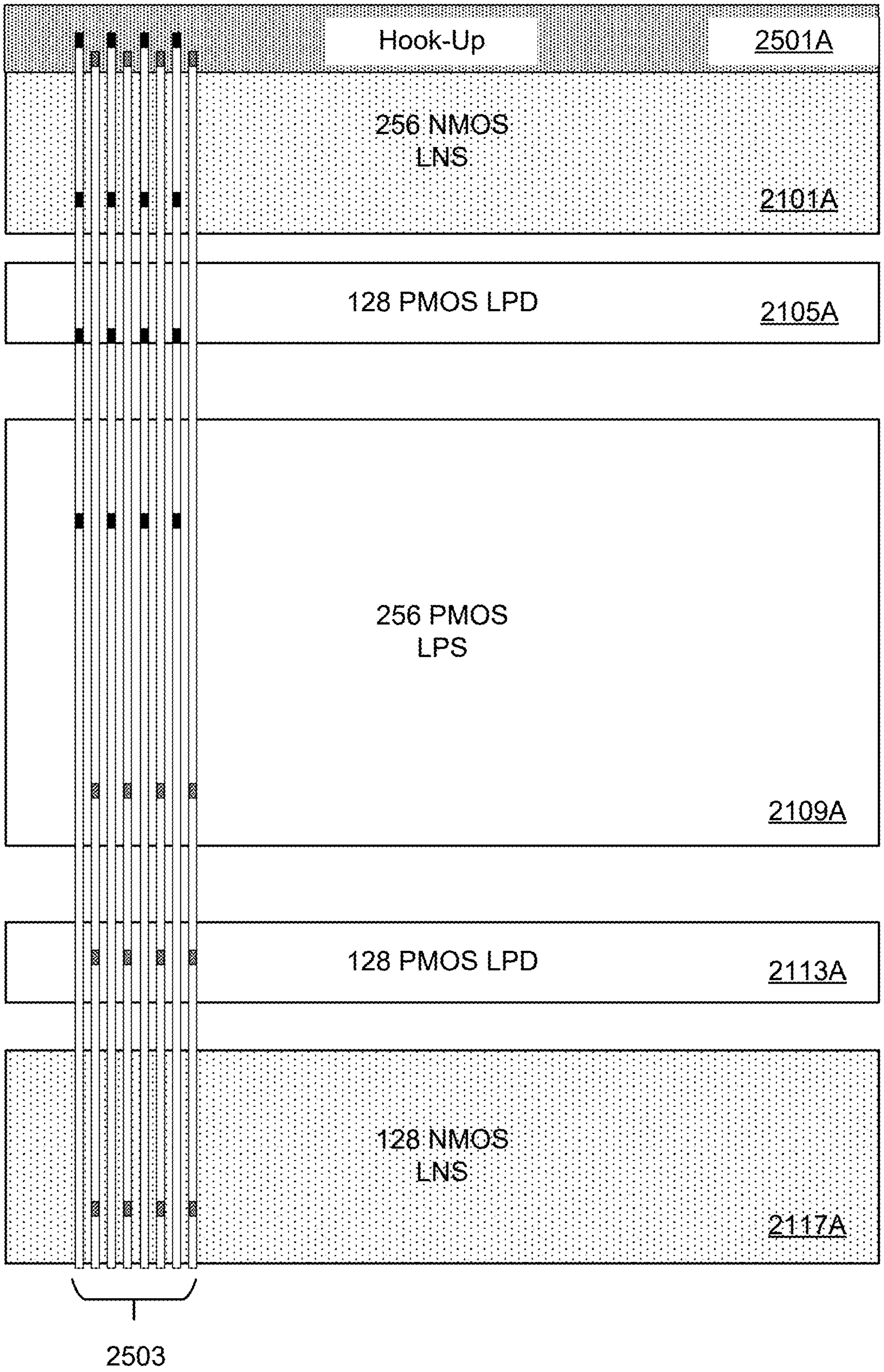
FIG. 26 is a detail of the lower left quadrant of FIG. 25 to illustrate the routing.

FIG. 26 is a detail of the lower left quadrant of FIG. 25 to illustrate the routing, where just the local select blocks 2117A, 2113A, 2109A, 2105A, and the lower (as presented in the figures) part of 2101A. In the hook-up region, the array vias are located allowing the m5 layers to attach to the array vias as illustrated in FIG. 24. The m4 and m5 lines then extend downward across the local select blocks 2117A, 2113A, 2109A, 2105A. In FIG. 25 and, more visibly, in FIG. 26, the black rectangles along the lines of 2503 are the connections of local select blocks 2109A (for the upper half), 2105A, and 2101A that are connected along m4, as shown in FIG. 24, and then to one of the m5 connection regions and on to the array vias. The stippled rectangles along the lines of 2503 are the connections of local select blocks 2109A (for the lower half), 2113A, and 2117A that are connected along m5, as shown in FIG. 24, and then to the array vias.

FIG. 27 is a flowchart of an embodiment for forming a memory device including the decoder structure of FIGS. 19A-26. The flow begins at step 2701 by forming a bipolar decoder circuit for a first set of control lines (i.e., a first of either bit lines or word lines) of a cross-point memory array, where the memory cells are connected between the first set of control lines and a second set of control lines (i.e., the other of the bit lines and the word lines). Examples of the cross-point array structure can be as described above with respect to FIGS. 7A-7D. The bipolar decoder will have both positive voltage select switches and negative voltage select switches, including the local positive select and local negative select switches that can be laid out as in the embodiment of FIG. 21. Both of the local positive select and local negative select switches can be formed a die as part of the same CMOS fabrication method at steps 2703 and 2705, where these will typically be formed as part of the same fabrication process.

At step 2703, the positive voltage select switches are configured to supply the positive voltage levels to the first set of control lines, as discussed with respect to FIGS. 19A and 19B for the bit line decoder example. As formed on the die and illustrated in FIG. 21, the positive voltage select switches have a first subset of PMOS LPS switches 2107A and 2107B and a second subset of PMOS LPS switches 2109A and 2109B. Between and to either side of the subsets of the LPS switches are located subsets of the negative select switches. These are formed in step 2705, which can be performed concurrently with step 2703, to supply the negative voltage levels to the first set of control lines. Although not included in the flow of FIG. 27, the example embodiment also forms the sets of PMOS LPD deselect switches between the sets of positive and negative select switches as shown in embodiment of FIG. 21.

The routing for connecting the switches is performed at step 2707. In the embodiments of FIGS. 22-26, these are the metal line layers m4 and m5 that connect each of the local select switches to the m5 layer connections in the hook-up regions 2501A and 2501B. At step 2711, the connections in the hook-up regions are then connected to the cross-point array, specifically to the array vias in the above examples. Depending on the embodiment, step 2711 can either include forming the array over the decoder structure or, in an embodiment such as FIG. 4, bonding the memory die to the control die on which the decoders are formed.

According to a first set of aspects, a nonvolatile memory device comprises a control circuit configured to connect to an array including a first plurality of nonvolatile memory cells, the array having a cross-point structure in which each of first plurality of the memory cells is connected between one of a plurality of bit lines and one of a plurality of first word lines, the control circuit comprising a first bipolar decoder configured to connect to the memory array to selectively bias a first of either each of the bit lines or each of the word lines to one of a positive voltage level, a ground voltage level, or a negative voltage level. The first bipolar decoder comprises: a plurality of local negative select switches each configured to supply the negative voltage level to a corresponding one of the first of the bit lines or the first word lines; a plurality of local positive select switches each configured to supply the positive voltage level to a corresponding one of the first of the bit lines or the first word lines, a first subset of a plurality of one of the local positive select switches and the local negative select switches located on a die between a first subset and a second subset of a plurality of the other of the local positive select switches and the local negative select switches; a plurality of connection points each configured to connect a corresponding one of each of the first of the bit lines or the first word lines, the connection points centrally located in a hook-up region located over the first subset the one of the local positive select switches and the local negative select switches; and a plurality of metal lines, each connecting a corresponding one of the local negative select switches and local positive select switches to a corresponding one of the connection points.

According to another set of aspects, a method includes forming on a first die a bipolar decoder circuit for a first set of control lines of a cross-point memory array of nonvolatile memory cells each connected between one of the first set of control lines and one of a second set of control lines. Forming the bipolar decoder circuit comprises: forming a plurality of positive voltage select switches each configured to supply a positive voltage level to a corresponding one of the first set of control lines, including forming first and second subsets of the plurality of positive voltage select switches on the first die; forming a plurality of negative voltage select switches each configured to supply a negative voltage level to a corresponding one of the first set of control lines, including forming a first subset of the plurality of negative voltage select switches on the first die between the first and second subsets of the plurality of positive voltage select switches; and forming a plurality of metal lines running over the positive voltage select switches and the negative, each of the metal lines connecting a corresponding one of either the positive voltage select switches or the negative voltage switches to a connection for the corresponding one of the first set of control lines, the connections located over a central region of the die.

In another set of aspects, a memory device comprises: a nonvolatile memory cell structure that includes nonvolatile memory cells in a cross-point arrangement, each memory cell having a programmable resistive element and connected between one of a plurality of first control lines and one of a plurality of second control lines; and one or more control circuits connected to the memory cell structure. The one or more control circuits comprise: a plurality of first decoding switches each configured to bias a corresponding one of the first control lines to positive voltage levels; a plurality of second decoding switches each configured to bias a corresponding one of the first control lines to negative voltage levels, a first subset of a plurality of the second decoding switches located on a die between a first subset of a plurality of the first decoding switches and a second subset of a plurality of the first decoding switches; and a plurality of routing lines each connecting a corresponding one of either the first decoding switches or the second decoding switches to a corresponding connection point for one of the first control lines, the connection points located over the first subset of the second decoding switches.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A nonvolatile memory device, comprising:

a control circuit configured to connect to an array including a first plurality of nonvolatile memory cells, the array having a cross-point structure in which each of a first plurality of the memory cells is connected between one of a plurality of bit lines and one of a plurality of first word lines, the control circuit comprising a first bipolar decoder configured to connect to the array to selectively bias a first of either each of the bit lines or each of the first word lines to one of a positive voltage level, a ground voltage level, or a negative voltage level, the first bipolar decoder comprising:

a plurality of local negative select switches each configured to supply the negative voltage level to a corresponding one of the bit lines or the first word lines;

a plurality of local positive select switches each configured to supply the positive voltage level to a corresponding one of the bit lines or the first word lines, a first subset of a plurality of one of the local positive select switches and the local negative select switches located on a die between a first subset and a second subset of a plurality of the other of the local positive select switches and the local negative select switches;

a plurality of connection points each configured to connect a corresponding one of each of the bit lines or the first word lines, the connection points centrally located in a hook-up region located over the first subset the one of the local positive select switches and the local negative select switches; and a plurality of metal lines, each connecting a corresponding one of the local negative select switches or the local positive select switches to a corresponding one of the connection points.

2. The nonvolatile memory device of claim 1, wherein the local positive select switches are PMOS devices and the local negative select switches are NMOS devices.

3. The nonvolatile memory device of claim 1, wherein the first bipolar decoder further comprises:

a plurality of local ground select switches each configured to set a corresponding one of the bit lines or the first word lines to ground, a first subset of the local ground select switches located on the die between the first subset of a plurality of one of the local positive select switches and the local negative select switches located on a die between the first subset of the other of the local positive select switches and the local negative select switches, and a second subset of the local ground select switches located on the die between the first subset of a plurality of one of the local positive select switches and the local negative select switches located on a die between the second subset of the other of the local positive select switches and the local negative select switches.

4. The nonvolatile memory device of claim 1, wherein the one of the local positive select switches and the local negative select switches are the local negative select switches.

5. The nonvolatile memory device of claim 1, wherein:

the first subset the plurality of the other of the local positive select switches and the local negative select switches is located on the die between the first subset of the one of the local positive select switches and the local negative select switches and a second subset of the plurality of the one of the local positive select switches and the local negative select switches, and the second subset the plurality of the other of the local positive select switches and the local negative select switches is located on the die between the first subset of the one of the local positive select switches and the local negative select switches and a third subset of the plurality of the one of the local positive select switches and the local negative select switches.

6. The nonvolatile memory device of claim 1, wherein the first bipolar decoder is configured to connect to the array to selectively bias the bit lines, the control circuit further comprising:

a second bipolar decoder configured to connect to the memory array to selectively bias the first word lines, the second bipolar decoder and the first bipolar decoder located one over another on the die.

7. The nonvolatile memory device of claim 6, wherein the array further comprises a second plurality of nonvolatile memory cells in which each of the second plurality of memory cells is connected between on the plurality of bit lines and one of a plurality of second word lines, the control circuit further comprising:

a third bipolar decoder configured to connect to the array to selectively bias the second word lines, the third bipolar decoder, the second bipolar decoder and the first bipolar decoder located one over another on the die.

8. The nonvolatile memory device of claim 1, further comprising the array, wherein the array is located on the die over the first bipolar decoder.

9. The nonvolatile memory device of claim 1, wherein the control circuit is formed on a control die, the nonvolatile memory device further comprising:

a memory die including the array, the memory die separate from and bonded to the control die.

10. The nonvolatile memory device of claim 1, further comprising the array, wherein the memory cells are magnetoresistive random access memory (MRAM) memory cells.

11. The nonvolatile memory device of claim 1, further comprising the array, wherein the memory cells are phase change memory (PCM) memory cells.

12. The nonvolatile memory device of claim 1, further comprising the array, wherein the first bipolar decoder further comprises:

a plurality of global negative select switches, each configures to receive and provide to a plurality of the local negative select switches a corresponding global negative select signal; and a plurality of global positive select switches, each configures to receive and provide to a plurality of the local positive select switches a corresponding global positive select signal.

13. The nonvolatile memory device of claim 12, wherein:

the global negative select switches are located on the die between multiple ones of the local negative select switches, and the global positive select switches are located on the die between multiple ones of the local positive select switches.

14. A method, comprising:

forming on a first die a bipolar decoder circuit for a first set of control lines of a cross-point memory array of nonvolatile memory cells each connected between one of the first set of control lines and one of a second set of control lines, comprising:

forming a plurality of positive voltage select switches each configured to supply a positive voltage level to a corresponding one of the first set of control lines, including forming first and second subsets of the plurality of positive voltage select switches on the first die;

forming a plurality of negative voltage select switches each configured to supply a negative voltage level to a corresponding one of the first set of control lines, including forming a first subset of the plurality of negative voltage select switches on the first die between the first and second subsets of the plurality of positive voltage select switches; and forming a plurality of metal lines running over the positive voltage select switches and the negative voltage select switches, each of the metal lines connecting a corresponding one of either the positive voltage select switches or the negative voltage switches to a connection for the corresponding one of the first set of control lines, the connections located over a central region of the first die.

15. The method of claim 14, further comprising:

forming the cross-point memory array over the bipolar decoder circuit on the first die.

16. The method of claim 14, further comprising:

forming the cross-point memory array on a second die; and bonding together the first die and the second die.

17. The method of claim 14, wherein the positive select switches are PMOS devices and the negative select switches are NMOS devices.

18. A memory device, comprising:

a nonvolatile memory cell structure that includes nonvolatile memory cells in a cross-point arrangement, each memory cell having a programmable resistive element and connected between one of a plurality of first control lines and one of a plurality of second control lines; and one or more control circuits connected to the memory cell structure, comprising:

a plurality of first decoding switches each configured to bias a corresponding one of the first control lines to positive voltage levels;

a plurality of second decoding switches each configured to bias a corresponding one of the first control lines to negative voltage levels, a first subset of a plurality of the second decoding switches located on a die between a first subset of the first decoding switches and a second subset of the first decoding switches, each of the first subset the first decoding switches and the second of the first decoding switches comprising multiple ones of the first decoding switches; and a plurality of routing lines each connecting a corresponding one of either the first decoding switches or the second decoding switches to a corresponding connection point for one of the first control lines, the connection points located over the first subset of the second decoding switches.

19. The memory device of claim 18, wherein the nonvolatile memory cell structure is located on the die over first decoding switches, the second decoding switches, and the routing lines, the nonvolatile memory cell structure further including:

a plurality of vias each connecting one of the first control lines to the corresponding connection point.

20. The memory device of claim 18, the one or more control circuits further comprising:

a plurality of third decoding switches each configured to bias a corresponding one of the first control lines to ground, a first subset of the third decoding switches located on the die between the first subset of the second decoding switches the first subset of the first decoding switches and a second subset of the third decoding switches located on the die between the first subset the second decoding switches the second subset of the first decoding switches.

* * * * *